United States Patent
Mizuno et al.

(10) Patent No.: US 7,145,712 B2
(45) Date of Patent: Dec. 5, 2006

(54) MICRO MIRROR UNIT AND METHOD OF MAKING THE SAME

(75) Inventors: Yoshihiro Mizuno, Kawasaki (JP); Satoshi Ueda, Kawasaki (JP); Osamu Tsuboi, Kawasaki (JP); Ippei Sawaki, Kawasaki (JP); Hisao Okuda, Kawasaki (JP); Norinao Kouma, Kawasaki (JP); Hiromitsu Soneda, Kawasaki (JP); Fumio Yamagishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/962,445

(22) Filed: Oct. 13, 2004

(65) Prior Publication Data

US 2005/0046980 A1   Mar. 3, 2005

Related U.S. Application Data

(62) Division of application No. 10/327,855, filed on Dec. 26, 2002, now Pat. No. 6,817,725.

(30) Foreign Application Priority Data

Jun. 11, 2002   (JP)   ............................. 2002-170291

(51) Int. Cl.
     *G02B 26/00*   (2006.01)

(52) U.S. Cl. ...................... 359/291; 359/290; 359/223; 359/224

(58) Field of Classification Search ................ 359/223, 359/224, 290, 291, 292, 295, 238
See application file for complete search history.

(56) References Cited

U.S. PATENT DOCUMENTS

| | | | | |
|---|---|---|---|---|
| 5,579,148 A | * | 11/1996 | Nishikawa et al. | .......... 359/214 |
| 5,920,417 A | * | 7/1999 | Johnson | ...................... 359/223 |
| 5,959,760 A | | 9/1999 | Yamada et al. | |
| 6,201,629 B1 | * | 3/2001 | McClelland et al. | ........ 359/223 |
| 6,256,134 B1 | * | 7/2001 | Dhuler et al. | ................ 359/212 |
| 6,388,789 B1 | * | 5/2002 | Bernstein | ..................... 359/198 |
| 6,396,619 B1 | * | 5/2002 | Huibers et al. | ............. 359/291 |
| 6,454,421 B1 | * | 9/2002 | Yu et al. | ....................... 359/872 |
| 6,526,198 B1 | * | 2/2003 | Wu et al. | ...................... 385/18 |
| 6,914,871 B1 | * | 7/2005 | Hara et al. | ............. 369/112.29 |
| 2002/0005976 A1 | * | 1/2002 | Behin et al. | ................. 359/254 |

FOREIGN PATENT DOCUMENTS

| | | |
|---|---|---|
| JP | 4-343318 | 11/1992 |
| JP | 11-52278 | 2/1999 |

* cited by examiner

*Primary Examiner*—Timothy Thompson
(74) *Attorney, Agent, or Firm*—Armstrong, Kratz, Quintos, Hanson & Brooks, LLP

(57) ABSTRACT

A micro mirror unit includes a moving part carrying a mirror portion, a frame and torsion bars connecting the moving part to the frame. The moving part, the frame and the torsion bars are formed integral from a material substrate. The frame includes a portion thicker than the moving part.

6 Claims, 25 Drawing Sheets

US 7,145,712 B2

MICRO MIRROR UNIT AND METHOD OF MAKING THE SAME

CROSS REFERENCE TO RELATED APPLICATION

This application is a division of Ser. No. 10/327,855, filed Dec. 26, 2002, which is based on Japanese Application No. 2002-170291 filed Jun. 11, 2002 now U.S. Pat. No. 6,817,725.

BACKGROUND OF THE INVENTION

1. Field of the Invention

The present invention relates to a micro mirror unit and a method of making it. The micro mirror unit is an element incorporated e.g. in an optical switching device which switches optical paths between a plurality of optical fibers, or in an optical disc drive which records data onto an optical disc and/or reproduces data recorded on it.

2. Description of the Related Art

In recent years, optical communications technology is utilized widely in a variety of fields. In the optical communications, optical fibers serve as a medium through which optical signals are passed. When the optical signal passing through a given optical fiber is switched to another optical fiber, so-called optical switching devices are used in general. In order to achieve high quality optical communications, the optical switching device must have high capacity, high speed and high reliability in switching action. In view of these, micro mirror units manufactured by micro-machining technology is attracting attention as a switching element to be incorporated in the optical switching device. The micro mirror units enable the switching operation without converting optical signals into electric signals between the optical paths on the input side and the output side of the optical switching device. This is advantageous to achieving the desired characteristics mentioned above.

Micro mirror units are disclosed e.g. in Japanese Patent Laid-Open No. 4-343318 and No. 11-52278. Further, optical switching devices which use micro mirror units manufactured by micro-machining technologies are disclosed in the article "*MEMS Components for WDM Transmission Systems*" (*Optical Fiber Communication* [OFC] 2002, pp.89–90 etc.

FIG. 21 outlines an ordinary optical switching device 500. The optical switching device 500 includes a pair of micro mirror arrays 501, 502, an input fiber array 503, an output fiber array 504, and a plurality of micro lenses 505, 506. The input fiber array 503 includes a predetermined number of input fibers 503a. The micro mirror array 501 is provided with the same plurality of micro mirror units 501a each corresponding to one of the input fibers 503a. Likewise, the output fiber array 504 includes a predetermined number of input fibers 504a. The micro mirror array 502 is provided with the same plurality of micro mirror units 502a each corresponding to one of the output fibers 504a. Each of the micro mirror units 501a, 502a has a mirror surface for reflection of light. The orientation of the mirror surface is controllable. Each of the micro lenses 505 faces an end of a corresponding input fiber 503a. Likewise, each of the micro lenses 506 faces an end of a corresponding output fiber 504a.

In transmitting optical signals, lights L1 coming out of the output fibers 503a pass through the corresponding micro lenses 505 respectively, thereby becoming parallel to each other and proceeding to the micro mirror array 501. The lights L1 reflect on their corresponding micro mirror units 501a respectively, thereby deflected toward the micro mirror array 502. At this point, the mirror surfaces of the micro mirror units 501a are oriented, in advance, in predetermined directions so as to direct the lights L1 to enter their respective desired micro mirror units 502a. Then, the lights L1 are reflected on the micro mirror units 502a, and thereby deflected toward the output fiber array 504. At this point, the mirror surfaces of the micro mirror units 502a are oriented, in advance, in predetermined directions so as to direct the lights L1 into their respective desired output fibers 504a.

As described, according to the optical switching device 500, the lights L1 coming out of the input fibers 503a reach the desired output fibers 504a due to the deflection by the micro mirror arrays 501, 502. In other words, a given input fiber 503a is connected with an output fiber 504a in a one-to-one relationship. With this arrangement, by appropriately changing deflection angles of the micro mirror units 501a, 502a, switching can be performed and the lights L1 can be deflected into different output fibers 504a.

FIG. 22 outlines another ordinary optical switching device 600. The optical switching device 600 includes a micro mirror array 601, a fixed mirror 602, an input-output fiber array 603, and a plurality of micro lenses 604. The input-output fiber array 603 includes a predetermined number of input fibers 603a and a predetermined number of output fibers 603b. The micro mirror array 601 includes the same plurality of micro mirror units 601a each corresponding to one of the fibers 603a, 603b. Each of the micro mirror units 601a has a mirror surface for reflection of light and orientation of the mirror surfaces is controllable. Each of the micro lenses 604 faces an end of a corresponding one of the fibers 603a, 603b.

In transmitting optical signals, light L2 coming out of the input fiber 603a passes through the corresponding micro lens 604 and is directed toward the micro mirror array 601. The light L2 is then reflected by a corresponding first micro mirror unit 601a, and thereby deflected toward the fixed mirror 602, reflected by the fixed mirror 602, and then enters a corresponding second micro mirror unit 601a. At this point, the mirror surface of the first micro mirror unit 601a is oriented, in advance, in a predetermined direction so as to direct the light L2 to enter a predetermined one of the micro mirror units 601a. Then, the light L2 is reflected on the second micro mirror unit 601a, and thereby deflected toward the input-output fiber array 603. At this point, the mirror surface of the second micro mirror unit 601a is oriented, in advance, in a predetermined direction so as to direct the light L2 to enter a predetermined one of the output fibers 603b.

As described, according to the optical switching device 600, the light L2 coming out of the input fiber 603a reaches the desired output fiber 603b due to the deflection by the micro mirror array 601 and the fixed mirror 602. In other words, a given input fiber 603a is connected with an output fiber 603b in a one-to-one relationship. With this arrangement, by appropriately changing deflection angles of the first and the second micro mirror units 601a, switching can be performed and the light L2 can be deflected into different output fibers 603b.

FIG. 23 is a perspective view, partly unillustrated, of a portion of a conventional micro mirror unit 700 for incorporation in such devices as the optical switching devices 500, 600. The micro mirror unit 700 includes a mirror-formed portion 710 having an upper surface provided with a mirror surface (not illustrated), an inner frame 720 and an outer frame 730 (partly unillustrated), each formed with come-like electrodes integrally therewith. Specifically, the mirror-formed portion 710 has ends facing away from each other, and a pair of comb-like electrodes 710a, 710b are formed respectively on these ends. In the inner frame 720 a pair of comb-like electrodes 720a, 720b extend inwardly, corresponding to the comb-like electrodes 710a, 710b. Also, a pair of comb-like electrodes 720c, 720d extend outwardly. In the outer frame 730 a pair of comb-like electrodes 730a, 730b extend inwardly, corresponding to the comb-like electrodes 720c, 720d. The mirror-formed portion 710 and the inner frame 720 are connected with each other by a pair of torsion bars 740. The inner frame 720 and the outer frame 730 are connected with each other by a pair of torsion bars 750. The pair of torsion bars 740 provides a pivotal axis for the mirror-formed portion 710 to pivot with respect to the inner frame 720. The pair of torsion bars 750 provides a pivotal axis for the inner frame 720, as well as for the associating mirror-formed portion 710, to pivot with respect to the outer frame 730.

With the above arrangement, in the micro mirror unit 700, a pair of comb-like electrodes, such as the comb-like electrode 710a and the comb-like electrode 720a, are opposed closely to each other for generation of static electric force, and take positions as shown in FIG. 24A, i.e. one of the electrode assuming a lower position and the other assuming an upper position, when there is no voltage applied. When an electric voltage is applied, as shown in FIG. 24B, the comb-like electrode 710a is drawn toward the comb-like electrode 720a, thereby pivoting the mirror-formed portion 710. More specifically, in FIG. 23, when the comb-like electrode 710a is given a positive charge whereas the comb-like electrode 720a is given a negative charge, the mirror-formed portion 710 is pivoted in a direction M1 while twisting the pair of torsion bars 740. On the other hand, when the comb-like electrode 720c is given a positive charge whereas the comb-like electrode 730a is given a negative charge, the inner frame 720 is pivoted in a direction M2 while twisting the pair of torsion bars 750.

As a conventional method, the micro mirror unit 700 can be made from an SOI (Silicon on Insulator) wafer which sandwiches an insulating layer between silicon layers. Specifically, first, as shown in FIG. 25A, a wafer 800 is prepared which has a layered structure including a first silicon layer 801, a second silicon layer 802, and an insulating layer 803 sandwiched between these silicon layers. Next, as shown in FIG. 25B, an anisotropic etching is performed to the first silicon layer 801 via a predetermined mask, to form the mirror-formed portion 710, torsion bars 140, the comb-like electrode 710a and other members to be formed on the first silicon layer 801. Next, as shown in FIG. 25C, an anisotropic etching is performed to the second silicon layer 802 via a predetermined mask, to form the comb-like electrode 720a and other members to be formed on the second silicon layer 802. Note that for the sake of simplification of the drawings, each of the FIG. 25A through FIG. 25C gives only one sectional view, and each view includes a plurality of sections taken at different locations in the wafer 800.

However, according to the conventional method of manufacture as described above, the thickness of the wafer 800 is directly reflected on the thickness of the micro mirror unit 700. Specifically, the thickness of the micro mirror unit 700 is identical with the thickness of the wafer 800 which is used for the formation of the micro mirror unit. For this reason, according to the conventional method, the material wafer 800 must have the same thickness as the thickness of the micro mirror unit 700 to be manufactured. This means that if the micro mirror unit 700 is to be thin, the wafer 800 of the same thinness must be used. For example, take a case of manufacturing a micro mirror unit 700 having a mirror surface having a size of about 100 through 1000 μm. In view of a mass of the entire moving part including the mirror-formed portion 710 and the inner frame 720, the amount of movement of the moving part, the size of the comb-like electrodes necessary for achieving the amount of movement, etc considered comprehensively, a desirable thickness of the moving part or the micro mirror unit 700 is determined. In this particular case the desirable thickness is 100 through 200 μm. As a result, in order to manufacture the micro mirror unit 700 having such a thickness, a wafer 800 having the thickness of 100 through 200 μm is used.

According to the conventional method, in order to manufacture a thin micro mirror unit 700, a correspondingly thin wafer 800 must be used. This means that the greater diameter the wafer 800 has, the more difficult to handle the wafer. For instance, take a case in which a micro mirror unit 700 is to be manufactured from an SOI wafer 800 having a thickness of 200 μm and a diameter of 6 inches. Often, the wafer 800 is broken in a midway of the manufacturing process. After formation of the predetermined structural members on the first silicon layer 801 as shown in FIG. 25B, strength of the wafer 800 is decreased, making especially difficult to handle the wafer during the machining on the second silicon layer 802. Thinness of the wafer 800 limits, as has been described, the size of the flat surface of the wafer due to handling difficulties. Further, the limitation on the size of the flat surface of the wafer places a limitation on the manufacture of micro mirror array chips. Specifically, when the micro mirror array chips are manufactured by forming a plurality of micro mirror units in an array pattern on a single substrate, the size of the array is limited.

FIG. 26 shows a micro mirror unit 700 mounted on a wiring substrate. In the figure, the micro mirror unit 700 shows a section taken on lines XXVI—XXVI in FIG. 23. According to the conventional micro mirror unit 700 in FIG. 23, the moving part including the mirror-formed portion 710 and the inner frame 720 has the same thickness as the outer frame 730. For this reason, when the micro mirror unit 700 is mounted onto the wiring substrate 810, in order to allow the moving part to move properly, a spacer 811 must be provided as shown in FIG. 26 between the wiring substrate 810 and the outer frame 730. By providing the spacer 811 having a sufficient thickness between the micro mirror unit 700 and the wiring substrate 810, it becomes possible to avoid a situation that the moving part makes contact to the wiring substrate 810 to become unable to move. In view of a mounting process of the micro mirror unit 700 onto the wiring substrate 810, it is not efficient to provide the spacer 811 separately.

SUMMARY OF THE INVENTION

The present invention has been proposed under the circumstances described above. It is therefore an object of the present invention to provide a micro mirror unit capable of reducing the limitation on the size of the flat surface of the wafer used for the manufacture. Another object of the present invention is to provide a method of making such a micro mirror unit.

According to a first aspect of the present invention, there is provided a micro mirror unit comprising: a moving part including a mirror portion; a frame; and a torsion bar connecting the moving part to the frame. The moving part, the frame and the torsion bar are formed integral from a common material substrate. The frame includes a portion thicker than the moving part.

With the above arrangement, the limitation on the size of the material substrate, or the wafer, used for manufacturing the micro mirror unit is reduced. The micro mirror unit according to the first aspect of the present invention includes a frame which has a portion thicker than the moving part. Therefore, even if the mass of the entire moving part, the amount of movement of the moving part, the size of the comb-like electrodes necessary for achieving the amount of movement and so on require the moving part to have a first thickness as thin as 100 through 200 μm for example, it is still possible to use a wafer having a second thickness thicker than the first thickness, in the manufacture of the micro mirror unit. When using such a wafer, the second thickness is maintained in a predetermined or larger area of the frame throughout steps for forming necessary members of the element, whereby the strength of the wafer can be maintained. As a result, it becomes possible to appropriately prevent the wafer from being destroyed, in the manufacturing process of the micro mirror unit.

As described, the micro mirror unit according to the first aspect of the present invention includes a frame which has a portion thicker than the moving part. This means that the frame extends beyond the moving portion at least on one side thickness-wise of the element. Therefore, if the frame extends sufficiently on the side away from the mirror surface of the moving part, it becomes possible to mount the micro mirror unit directly onto a wiring substrate via the frame. This is because the frame extending sufficiently provides appropriate space between the moving part and the wiring substrate, and as a result, the movement of the moving part is not hindered by the wiring substrate. On the other hand, if the frame extends sufficiently on the same side as is the mirror surface of the moving part, it becomes possible to bond a transparent cover such as a glass plate directly onto the micro mirror unit to protect the mirror surface. This is because the frame extending sufficiently provides appropriate space between the moving part and the transparent cover, and as a result, the movement of the moving part is not hindered by the transparent cover.

As described, according to the micro mirror unit offered by the first aspect of the present invention, it is possible to reduce the limitation on the size of the flat surface of the wafer used for the manufacture. Further, it becomes possible to appropriately bond adjacent members such as a wiring substrate and a transparent cover without using spacers prepared separately.

According to a second aspect of the present invention, there is provided another micro mirror unit comprising a moving part, a frame and a torsion bar connecting the moving part to the frame. The moving part, the frame and the torsion bar are formed integral from a material substrate having a layered structure including an intermediate layer and silicone layers sandwiching the intermediate layer.

The moving part includes: a first intermediate portion originating from the intermediate layer; a first structural member held in contact with the first intermediate portion and provided with a mirror portion; and a second structural member held in contact with the first intermediate portion on a side opposite to the first structural member.

The frame includes: a second intermediate portion originating from the intermediate layer; a third structural member held in contact with the second intermediate portion on a same side as the first structural member; and a fourth structural member held in contact with the second intermediate portion on a same side as the second structural member, and The fourth structural member extends beyond the second structural member in a layering direction of the layered structure.

An micro mirror unit having such an arrangement can also reduce the limitation on the size of the flat surface of the wafer used for the manufacture as described for the first aspect. Further, again as described for the first aspect, it is possible to appropriately bond adjacent members such as a wiring substrate without using separate spacers. A preferred embodiment of the micro mirror unit according to the second aspect further comprises a wiring substrate bonded to the fourth structural member.

Preferably, the micro mirror unit may further comprise a wiring substrate bonded to the fourth structural member. Also, the third structural member may extend beyond the first structural member in the layering direction.

According to a third aspect of the present invention, there is provided a micro mirror unit comprising a moving part, a frame and a torsion bar connecting the moving part to the frame. The moving part, the frame and the torsion bar are formed integral from a common material substrate having a layered structure including an intermediate layer and silicone layers sandwiching the intermediate layer.

The moving part includes: a first intermediate portion originating from the intermediate layer; a first structural member held in contact with the first intermediate portion and provided with a mirror portion; and a second structural member held in contact with the first intermediate portion on a side opposite to the first structural member.

The frame includes: a second intermediate portion originating from the intermediate layer; a third structural member held in contact with the second intermediate portion on a same side as the first structural member; and a fourth structural member held in contact with the second intermediate portion on a same side as the second structural member.

The third structural member extends beyond the first structural member in a layering direction of the layered structure.

Preferably, the micro mirror unit may further comprise a transparent cover bonded to the third structural member.

Preferably, in the respective micro mirror units described above, the moving part may include a first comb-like electrode, and the frame may include a second comb-like electrode for operation of the moving part by static electric force generated between the first and the second comb-like electrodes.

Preferably, the first comb-like electrode may be formed in the first structural member, and the second comb-like electrode may be formed in the fourth structural member at a portion contacting the second intermediate portion.

Preferably, in the respective micro mirror units described above, the moving part may include: a relay frame connected to the frame via the torsion bar; a mirror-formed portion spaced from the relay frame; and a relay bar connecting the relay frame to the mirror-formed portion, the relay bar extending in a direction across a direction in which the torsion bar extends.

In the above case, the mirror-formed portion may include a third comb-like electrode, and the relay frame may include a fourth comb-like electrode for operation of the mirror-formed portion by static electric force generated between the third and the fourth comb-like electrodes. The third comb-like electrode may be formed in the first structural member, while the fourth comb-like electrode may be formed in the second structural member.

According to a fourth aspect of the present invention, there is provided a method for making a micro mirror unit provided with a moving part, a frame and a torsion bar. The method includes the steps of:

performing first etching to a material substrate in a thickness direction of the substrate by using a first masking pattern and a second masking pattern, the first masking pattern being arranged to mask a region of the substrate that is to become at least a part of the frame, the second masking pattern being provided with a portion for masking a region of the substrate that is to become the moving part;

removing the second masking pattern; and performing second etching to the material substrate by using the first masking pattern.

Preferably, the first etching may be performed midway in the thickness direction of the substrate, the second etching being performed to penetrate the material substrate so that at least the moving part is formed.

Preferably, the first etching may be performed until the material substrate is penetrated, the second etching being performed midway in the thickness direction of the substrate so that at least the moving part is formed.

According to a fifth aspect of the present invention, there is provided a method for making a micro mirror unit from a material substrate that includes a first silicon layer, a second silicon layer and an intermediate layer sandwiched between these silicon layers. The micro mirror unit to be produced includes a moving part, a frame and a torsion bar. The method includes the steps of:

performing first etching to the first silicon layer of the material substrate by using a first masking pattern and a second masking pattern, the first masking pattern being arranged to mask a region of the first silicon layer that is to become at least a part of the frame, the second masking pattern including a portion for masking a region of the first silicon layer that is to become the moving part;

removing the second masking pattern; and performing second etching to the first silicon layer by using the first masking pattern.

Preferably, the first etching may be performed midway in a thickness direction of the first silicon layer, the second etching being performed until the intermediate layer is reached.

Preferably, the first etching may be performed until the intermediate layer is reached, and the second etching may be performed midway in a thickness direction of the first silicon layer.

Preferably, the second masking pattern may further include a portion for masking a region of the first silicon layer that is to become a comb-like electrode in the frame.

According to a sixth aspect of the present invention, there is provided a method for making a micro mirror unit by using a first material substrate including a first silicon layer, a second silicon layer and an intermediate layer sandwiched between these silicon layers, the micro mirror unit including a moving part, a frame and a torsion bar. The method includes the steps of:

forming a first masking pattern including a portion for masking a region of the first silicon layer that is to become the moving part;

making a second material substrate incorporating the first masking pattern, by bonding a third silicon layer to a surface of the first silicon layer upon which the first masking pattern is formed;

performing first etching to the third silicon layer by using a second masking pattern including a portion for masking at least a part of the frame, the first etching being continued until the first silicon layer is reached; and performing second etching to the first silicon layer exposed by the first etching, the second etching being performed by using the first masking pattern until the intermediate layer is reached.

Preferably, the first masking pattern may further include a portion for masking a region to become a comb-like electrode formed in the frame.

According to a seventh aspect of the present invention, there is provided a method for making a micro mirror unit that includes a moving part, a frame provided with a comb-like electrode and a torsion bar connecting the moving part to the frame. The method includes the steps of:

performing first etching to a first silicon layer prepared as a first material substrate, the first etching being performed by using a first masking pattern including a portion to mask a region of the first material substrate that is to become the comb-like electrode, the first etching being continued until the etching reaches a depth corresponding to a thickness of the comb-like electrode;

making a second material substrate that includes the first material substrate, an intermediate layer held in contact with the first material substrate, and a second silicon layer held in contact with the intermediate layer;

performing second etching to the first silicon layer by using a second masking pattern and a third masking pattern, the second masking pattern including a portion to mask a region to become at least a part of the frame, the third masking pattern including a portion to mask a region to become the moving part and the comb-like electrode, the second etching being continued until the etching reaches a midway portion of the first silicon layer;

removing the third masking pattern; and performing third etching to the first silicon layer by using the second masking pattern until the comb-like electrode is reached.

According to an eighth aspect of the present invention, there is provided a method for making a micro mirror unit by using a first material substrate including a first silicon layer, a second silicon layer and an intermediate layer sandwiched between these silicon layers, the first silicon layer incorporating a torsion bar held in contact with the intermediate layer, the micro mirror unit including a moving part, a frame and the torsion bar. The method includes the steps of:

forming a first masking pattern on the first silicon layer, the first masking pattern including a portion to mask a region to become the moving part;

making a second material substrate incorporating the first masking pattern, by bonding a third silicon layer to a surface of the first silicon layer upon which the first masking pattern is formed;

performing first etching to the third silicon layer by using a second masking pattern including a portion to mask a region to become at least a part of the frame, the etching being continued until the first masking pattern is exposed; and performing second etching to the first silicon layer by using the first masking pattern until the intermediate layer is reached.

The methods according to the fourth through the eighth aspects of the present invention enable manufacture of the micro mirror units according to the first through the third aspects of the present invention. Therefore, according to the methods offered by the fourth through the eighth aspects, it is possible to reduce the limitation on the size of the flat surface of the wafer used for the manufacture. Further, it is possible to appropriately bond adjacent members to the manufactured element without using separate spacers.

Other features and advantages of the present invention will become apparent from the detailed description given below with reference to the accompanying drawings.

DETAILED DESCRIPTION OF THE PREFERRED EMBODIMENT

Preferred embodiments of the present invention will be described below with reference to the accompanying drawings.

Figure 1:
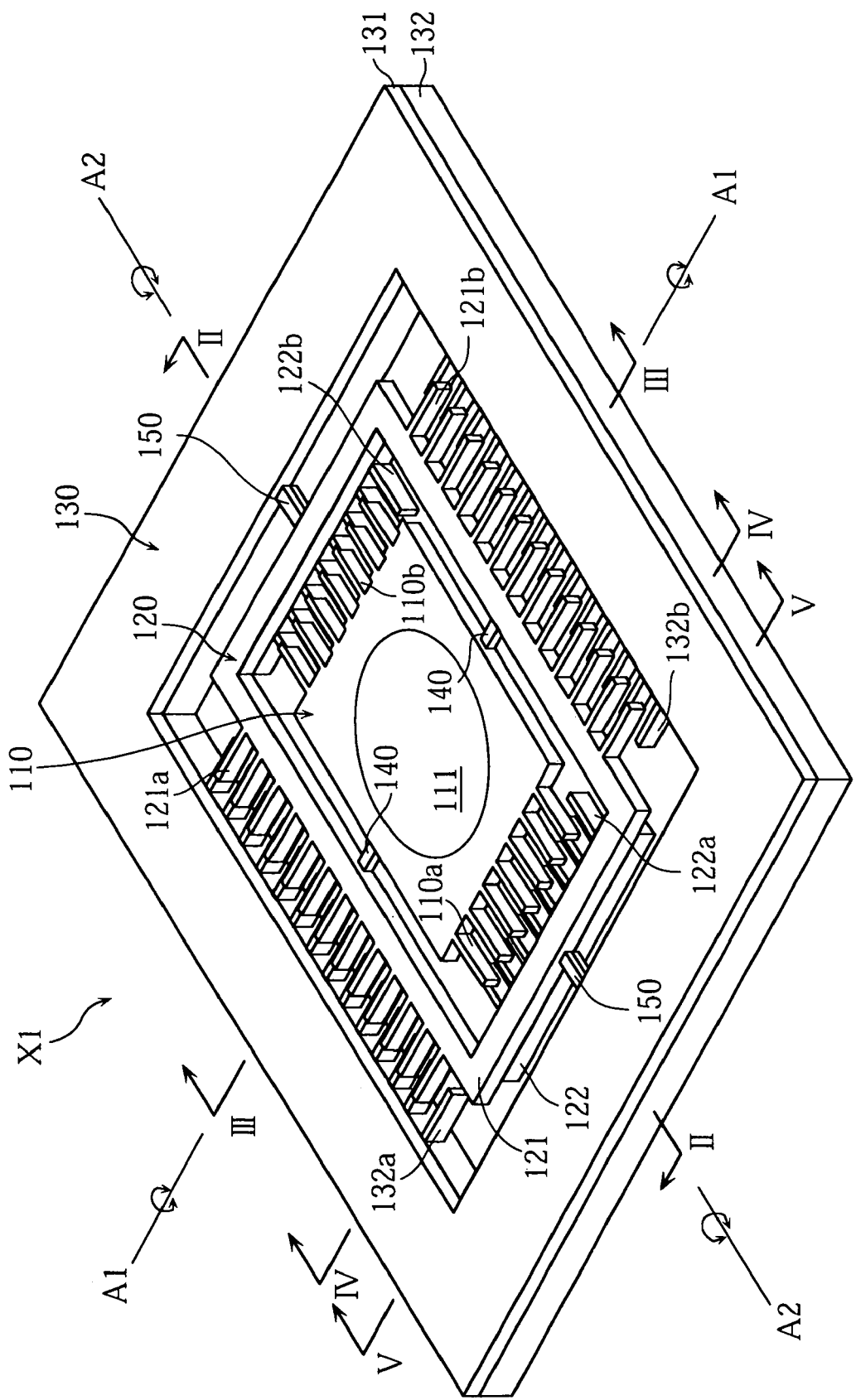
FIG. 1 is a perspective view of a micro mirror unit according to a first embodiment of the present invention.

FIG. 1 is a perspective view of a micro mirror unit X1 according to a first embodiment of the present invention.

Figure 2:
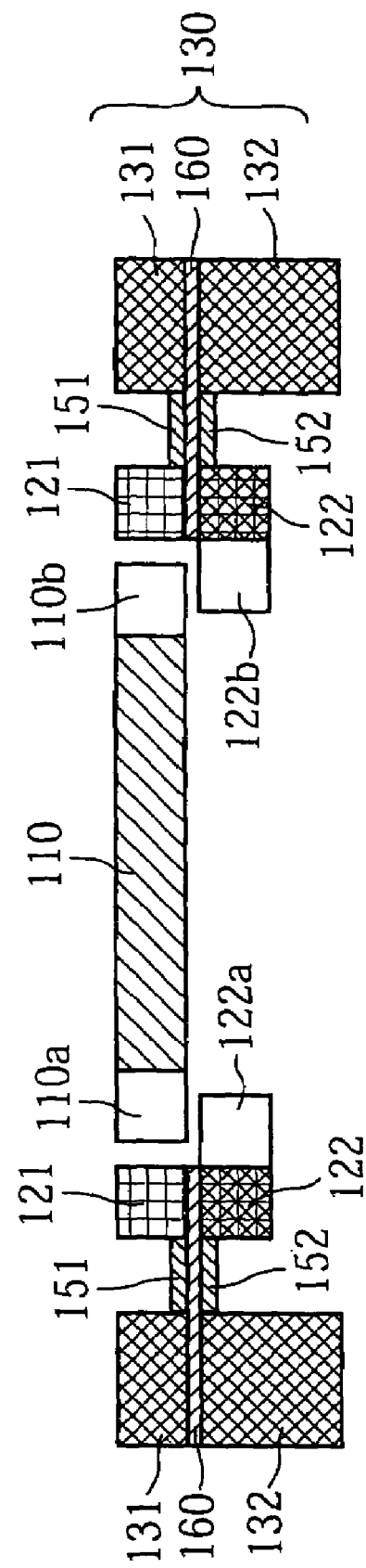
FIG. 2 is a sectional view of the micro mirror unit taken in lines II—II in FIG. 1.

FIG. 2 is a sectional view taken in lines II—II in FIG. 1.

Figure 3:
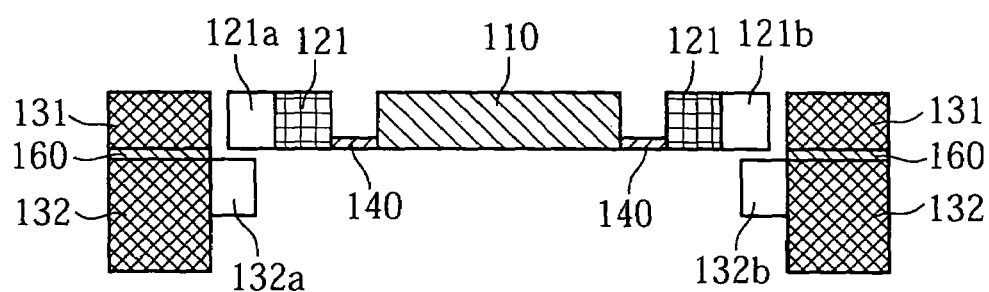
FIG. 3 is a sectional view of the micro mirror unit taken in lines III—III in FIG. 1.
Figure 4:
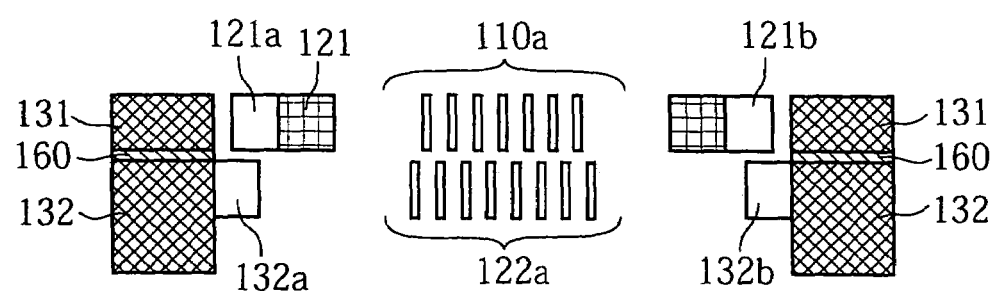
FIG. 4 is a sectional view of the micro mirror unit taken in lines VI—VI in FIG. 1.

FIG. 3 is a sectional view taken in lines III—III in FIG. 1, and FIG. 4 is a sectional view taken in lines VI—VI in FIG. 1.

As shown in FIG. 1, the micro mirror unit X1 includes a mirror-formed portion 110, an inner frame 120 surrounding it, an outer frame 130 surrounding the inner frame 120, a pair of torsion bars 140 connecting the mirror-formed portion 110 with the inner frame 120 and a pair of torsion bars 150 connecting the inner frame 120 with the outer frame 130. The pair of torsion bars 140 provides a pivotal axis A1 for the mirror-formed portion 110 to pivot with respect to the inner frame 120. The pair of torsion bars 150 provides a pivotal axis A2 for the inner frame 120, as well as the associating mirror-formed portion 110, to pivot with respect to the outer frame 130. According to the present embodiment, the pivotal axis A1 and the pivotal axis A2 are generally perpendicular to each other. The micro mirror unit X1 is a single piece structure made of electrically conductive material, except for its mirror surface 111 and insulating layer 160 to be described later. The electrically conductive material is provided by e.g. silicon and poly-silicon doped with an n-type impurity such as P and As or with a p-type impurity such as B.

The mirror-formed portion 110 has an upper surface formed with a thin film of mirror surface 111. Further, the mirror-formed portion 110 has two side surfaces facing away from each other and formed with comb-like electrodes 110a, 110b respectively.

The inner frame 120, which will be understood more clearly by referring to all of the FIG. 1 through FIG. 4, has a layered structure including an inner frame main portion 121, a pair of electrode bases 122 and an insulating layer 160 placed between them. The inner frame main portion 121 and the electrode bases 122 are electrically separated by the insulating layer 160. The pair of electrode bases 122 are formed respectively with inwardly extending comb-like electrodes 122a, 122b. The inner frame main portion 121 has, as integral parts therewith, outwardly extending comb-like electrodes 121a, 121b. As shown clearly in FIG. 2, the comb-like electrodes 122a, 122b are below the comb-like electrodes 110a, 110b of the mirror-formed portion 110. The comb-like electrodes 110a, 110b and 122a, 122b are positioned so as not to interfere with each other when the mirror-formed portion 110 pivots, in a pattern shown e.g. for the comb-like electrode 110a and the comb-like electrode 122a in FIG. 4, i.e. their teeth are staggered each other.

As clearly shown in FIG. 3, the pair of torsion bars 140 are each thinner than the mirror-formed portion 110, and are connected to the mirror-formed portion 110 as well as to the inner frame main portion 121.

As clearly shown in FIG. 2, the outer frame 130 has a layered structure including a first outer frame 131, a second outer frame 132 and an insulating layer 160 between them. The first outer frame 131 and the second outer frame 132 are electrically separated by the insulating layer 160. As clearly shown in FIG. 3, the second outer frame 132 is formed, as integral parts thereof, with inwardly extending comb-like electrodes 132a, 132b. The comb-like electrodes 132a, 132b are below the comb-like electrodes 121a, 121b respectively of the inner frame main portion 121. The comb-like electrodes 121a, 121b and 132a, 132b are positioned in a staggered pattern so as not to interfere with each other when the inner frame 120 pivots. As clearly shown in FIG. 2 through FIG. 4, the second outer frame 132 extends downwardly beyond the electrode bases 122 and the comb-like electrodes 122a, 122b of the inner frame 120 that serves as the moving part, as well as beyond the comb-like electrodes 132*a*, 132*b* formed in the outer frame 130, by a predetermined length.

Each of the torsion bars 150, as shown in FIG. 2, has a layered structure including an upper layer 151, a lower-layer 152 and an insulating layer 160 between them. The upper layer 151 and the lower layer 152 are electrically separated by the insulating layer 160. The upper layer 151 is connected to the inner frame main portion 121 and the first outer frame 131 whereas the lower layer 152 is connected to the electrode bases 122 and the second outer frame 132.

According to the micro mirror unit X1 having a structure as described above, when the first outer frame 131 is grounded, the members made of the same silicon material as and formed integrally with the first outer frame 131, i.e. the upper layer 151 of the torsion bars 150, the inner frame main portion 121, the torsion bars 140 and the mirror-formed portion 110, provide an electrical path that grounds the comb-like electrodes 110*a*, 110*b* and the comb-like electrodes 121*a*, 121*b*. Under this state, by giving a predetermined electric potential to the comb-like electrode 122*a* or the comb-like electrode 122*b* thereby generating a static electric force between the comb-like electrode 110*a* and the comb-like electrode 122*a* or between the comb-like electrode 110*b* and the comb-like electrode 122*b*, it becomes possible to pivot the mirror-formed portion 110 about the pivotal axis A1. Likewise, by giving a predetermined electric potential to the comb-like electrode 132*a* or the comb-like electrode 132*b* thereby generating a static electric force between the comb-like electrode 121*a* and the comb-like electrode 132*a* or between the comb-like electrode 121*b* and the comb-like electrode 132*b*, it becomes possible to pivot the mirror-formed portion 110 about the pivotal axis A2. The second outer frame 132 is electrically divided by air gaps for example, so as to provide electrical paths necessary for selectively giving the electric potential to the comb-like electrodes 122*a*, 122*b*, 132*a*, and 132*b*.

Figure 5:
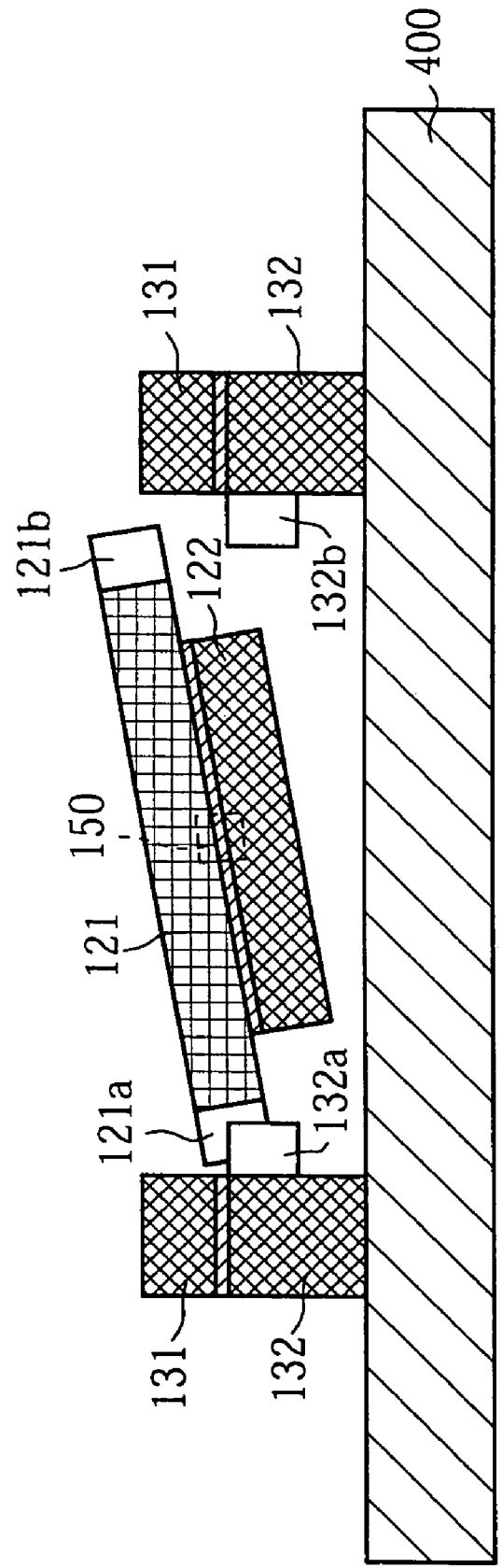
FIG. 5 shows a state in which the micro mirror unit in FIG. 1 is in operation.

FIG. 5 shows the micro mirror unit X1 mounted on a wiring substrate 400. The micro mirror unit X1 is shown in a sectional view taken in lines V—V in FIG. 1. According to the micro mirror unit X1, the outer frame 130 is thicker than the moving part which includes the mirror-formed portion 110 and the inner frame 120. Specifically, the second outer frame 132 of the outer frame 130 extends downwardly beyond the electrode bases 122 and the comb-like electrodes 122*a*, 122*b* of the inner frame 120, as well as beyond the comb-like electrodes 132*a*, 132*b* formed in the outer frame 130, by a predetermined length. The downward extension of the second outer frame 132 is beyond a depth reached by the moving part in operation, e.g. a depth reached by the electrode bases 122 of the inner frame 120. With this arrangement, a space is provided for the moving part to move under the state in which the wiring substrate 400 is bonded onto the bottom surface of the second outer frame 132, avoiding an unwanted contact of the moving part to the wiring substrate 400. Therefore, when the micro mirror unit X1 is mounted onto the wiring substrate 400, there is no need for placing a spacer between the micro mirror unit X1 and the wiring substrate 400.

FIG. 6 through FIG. 8 show a first method of making the micro mirror unit X1. This is a method for manufacturing the above-described micro mirror unit X1 by way of micro-machining technology. For the sake of simplification of the drawings, each of the FIG. 6 through FIG. 8 gives only one sectional view to show how formation is made for a mirror-formed portion M, torsion bars T, inner frame F1, a set of comb-like electrodes E1, E2, and an outer frame F2. In effect, each of these sectional views provides a model that shows different sections of the material substrate to which micro machining is made. Specifically, the mirror-formed portion M represents a fragmentary section of the mirror-formed portion 110, the torsion bars T represents a cross section of the torsion bars 140 or a fragmentary section of the torsion bars 150, the inner frame F1 represents a fragmentary cross section of the inner frame 120 including the inner frame main portion 121 and the electrode bases 122, the comb-like electrodes E1 represents a fragmentary cross section of the comb-like electrodes 110*a*, 110*b* or the comb-like electrodes 121*a*, 121*b*, the comb-like electrodes E2 represents a fragmentary cross section of the comb-like electrodes 122*a*, 122*b* or the comb-like electrodes 132*a*, 132*b*, and the outer frame F2 represents a fragmentary section of the outer frame 130 including the first outer frame 131 and the second outer frame 132.

Figure 6A:
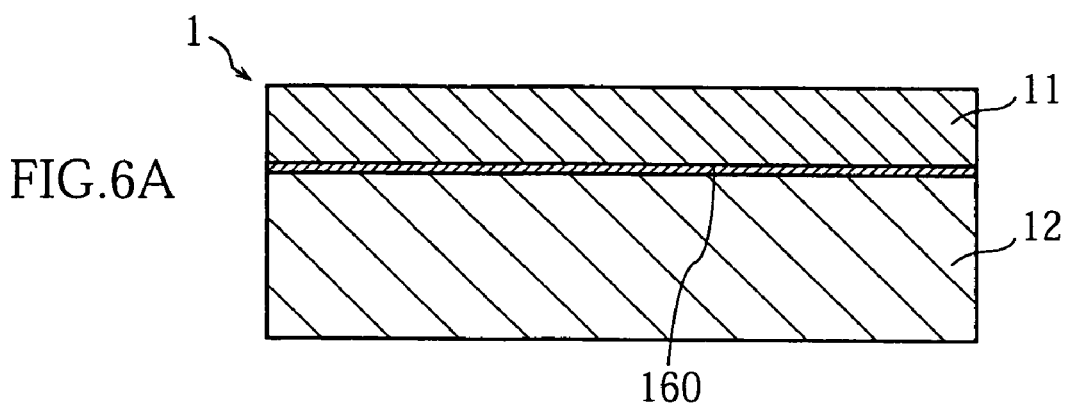
FIGS. 6A–6D show steps of a method of manufacturing the micro mirror unit in FIG. 1.

In the manufacture of the micro mirror unit X1, first, as shown in FIG. 6A, a substrate is prepared. The substrate is provided by an SOI (Silicon on Insulator) wafer 1. The SOI wafer 1 has a layered structure including a relatively thin first silicon layer 11, a relatively thick second silicon layer 12, and an insulating layer 160 which is an intermediate layer sandwiched between them. The first silicon layer 11 is provided by an electrically conductive silicon doped with an n-type impurity such as P and As. The second silicon layer 12 is provided by an electrically conductive silicon or poly-silicon doped with an n-type impurity such as P and As. Alternatively, these materials may be given electrical conductivity with a p-type impurity such as B. The insulating layer 160 is provided by silicon oxide grown on a surface of the first silicon layer 11 or the second silicon layer 12 by way of a thermal oxidation method. Alternatively to the thermal oxidation method, the insulating layer 160 may be formed by using a CVD method. After the formation of the insulating layer 160, the first silicon layer 11 and the second silicon layer 12 are bonded together, with the insulating layer 160 in between, whereby the SOI wafer 1 is completed. According to the present embodiment, the first silicon layer 11 has a thickness of 100 μm, the second silicon layer 12 has a thickness of 200 μm, and the insulating layer 160 has a thickness of 1 μm.

Figure 6B:
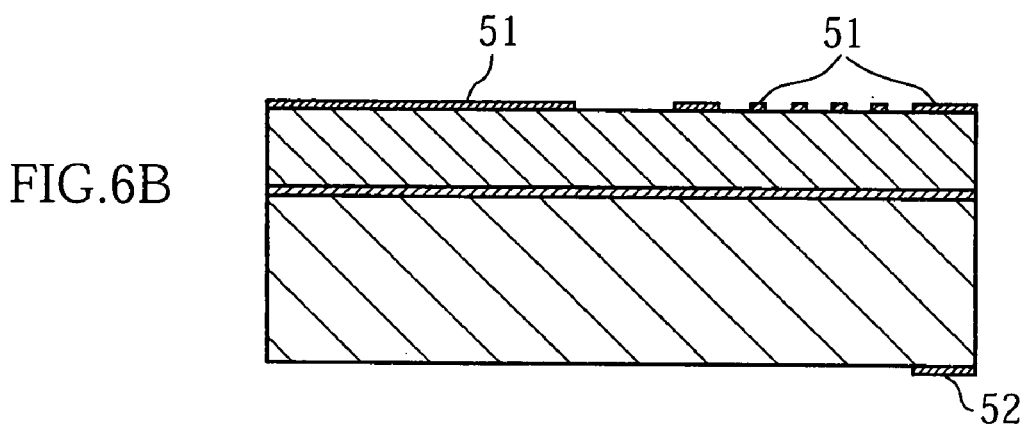

Next, as shown in FIG. 6B, an oxide film pattern 51 is formed on the first silicon layer 11, and an oxide film pattern 52 is formed on the second silicon layer 12. Specifically, first, a CVD method is used for growing a film of silicon oxide on the first silicon layer 11 and on the second silicon layer 12. Then, the oxide films are etched via respective predetermined masks. A usable etching solution in this patterning step is, for example, buffered hydrofluoric acid containing hydrofluoric acid and ammonium fluoride. It should be noted that oxide film pattern formations in later steps can also be performed by using such a process as described here. The oxide film pattern 51 is to mask regions to become the mirror-formed portion M, the inner frame F1, the comb-like electrodes E1, and the outer frame F2 on the first silicon layer 11. More specifically, the oxide film pattern 51 is formed correspondingly to a plan-view layout of the mirror-formed portion 110, the inner frame main portion 121, the comb-like electrodes 110*a*, 110*b*, the comb-like electrodes 121*a*, 121*b*, and the first outer frame 131 shown in FIG. 1. The oxide film pattern 52 is to mask regions to become the outer frame F2 on the second silicon layer 12. More specifically, the oxide film pattern 52 is formed correspondingly to a plan-view layout of the second outer frame 132 shown in FIG. 1.

Figure 6C:
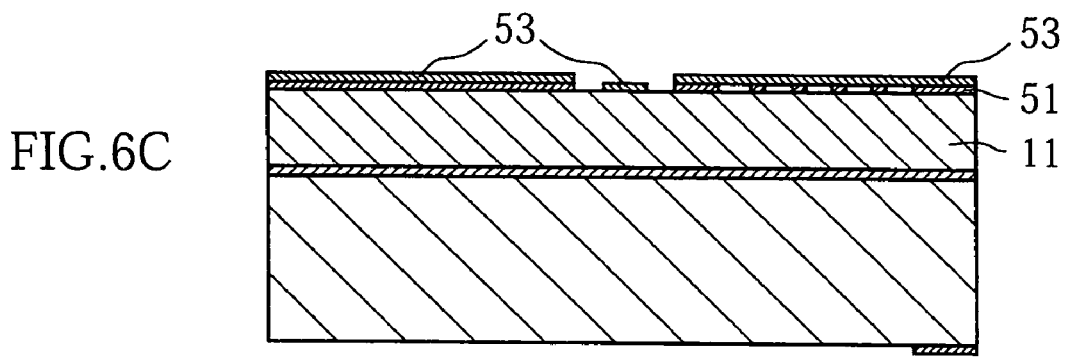

Next, as shown in FIG. 6C, a resist pattern 53 is formed on the first silicon layer 11. Specifically, a liquid photo resist is applied by means of spin-coating to form a film on the first silicon layer 11. The film is then exposed and developed to become the resist pattern 53. The photo resist usable in this step includes, for example, AZP4210 (manufactured by Clariant Japan) and AZ1500 (manufactured by Clariant Japan). It should be noted that resist pattern formations performed in later steps can also be made by such a process as described here, of photo resist film formation, exposure and development. The resist pattern 53 is to mask regions to become the mirror-formed portion M, the torsion bars T, the inner frame F1, the comb-like electrodes E1, and the outer frame F2 on the first silicon layer 11. More specifically, the resist pattern 53 is formed correspondingly to a plan-view layout of the mirror-formed portion 110, the torsion bars 140, 150, the inner frame main portion 121, the comb-like electrodes 110a, 10b, the comb-like electrodes 121a, 121b, and the first outer frame 131 shown in FIG. 1.

Figure 6D:
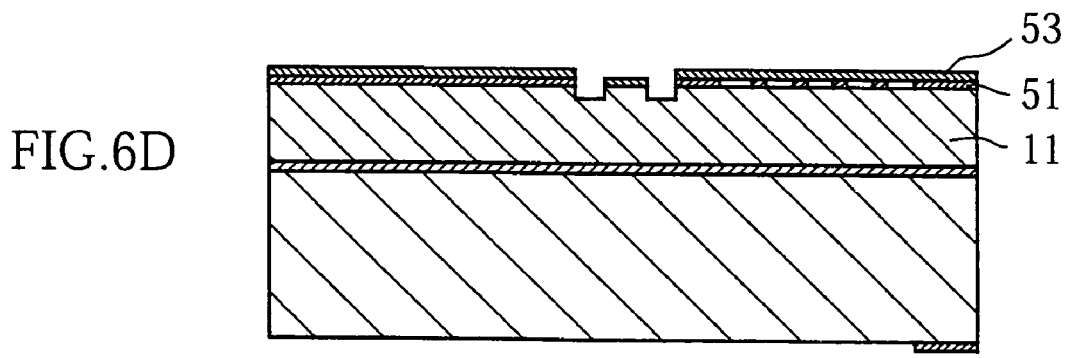

Next, as shown in FIG. 6D, the first silicon layer 11 masked by the resist pattern 53 is etched by means of DRIE (Deep Reactive Ion Etching) to a depth equal to the thickness of the torsion bars T. In the present embodiment, this depth is 5 μm. During the DRIE, when performing the Bosch process in which etching is alternated with sidewall protection, the etching with $SF_6$ gas is performed for about 8 seconds, which is then followed by the sidewall protection with $C_4F_8$ gas performed for about 6.5 seconds, with a bias power applied to the wafer being about 23 W. These conditions allow sufficient etching. The same conditions can also be used for DRIE processes performed in later steps.

Figure 7A:
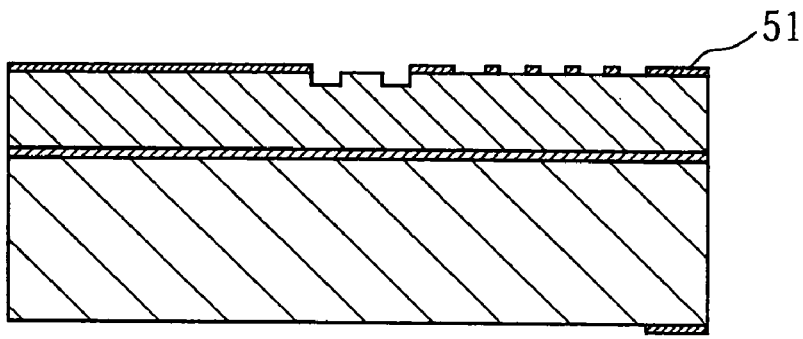
FIGS. 7A–7D show steps following those of FIG. 6.

Next, as shown in FIG. 7A, the resist pattern 53 is removed. The removing solution can be provided by AZ remover 700 (manufactured by Clariant Japan). This can also be used for removal of resist patterns performed in later steps.

Figure 7B:
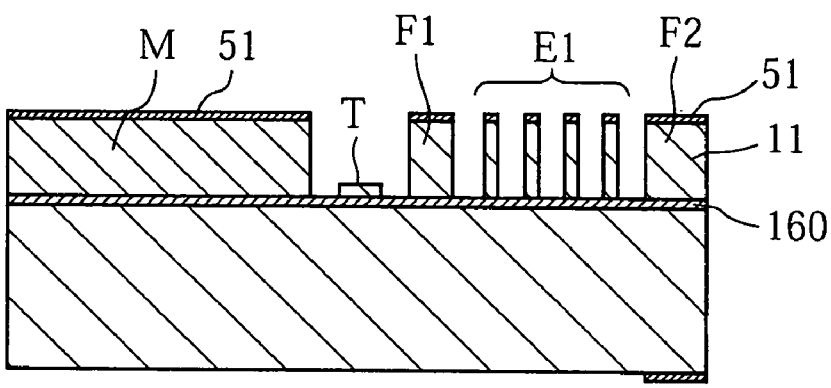

Next, as shown in FIG. 7B, using the DRIE, the first silicon layer 11 masked by the oxide film pattern 51 is etched until the insulating layer 160 is reached. This step gives form to the mirror-formed portion M, the torsion bars T, part of the inner frame F1, the comb-like electrode E1 and part of the outer frame F2.

Figure 7C:
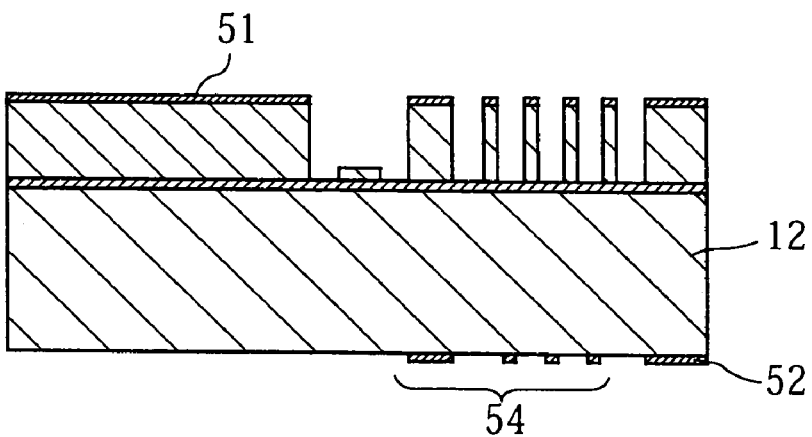

Next, as shown in FIG. 7C, a resist pattern 54 is formed on the second silicon layer 12. The resist pattern 54 is to mask the inner frame F1 and the comb-like electrode E2 on the second silicon layer 12. More specifically, the resist pattern 54 is formed correspondingly to the plan-view layout of the electrode bases 122, the comb-like electrodes 122a, 122b, and the comb-like electrodes 132a, 132b shown in FIG. 1.

Figure 7D:
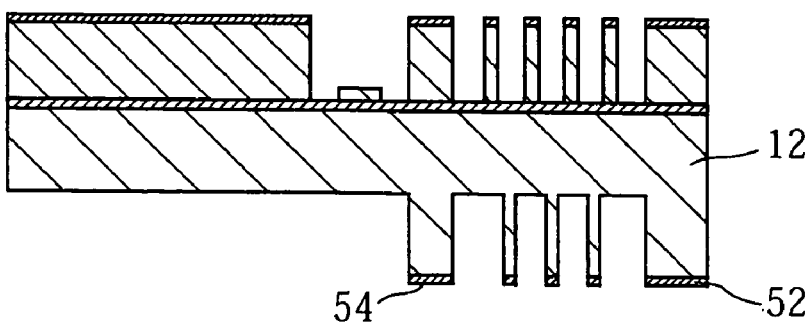

Next, as shown in FIG. 7D, the second silicon layer 12 masked by the oxide film pattern 52 and the resist pattern 54 is etched by means of DRIE, to a depth equal to the thickness of the comb-like electrode E2.

Figure 8A:
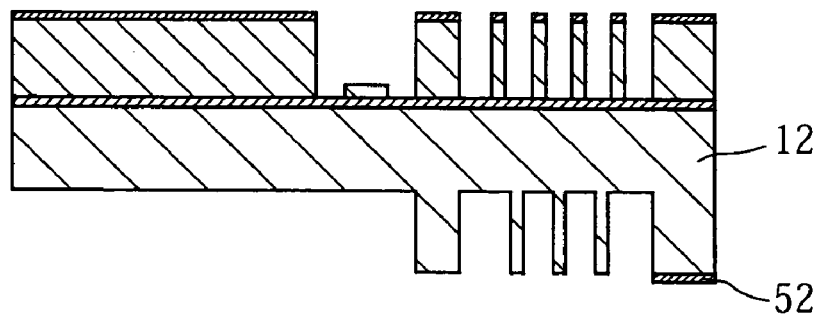
FIGS. 8A–8C show steps following those of FIG. 7.
Figure 8B:
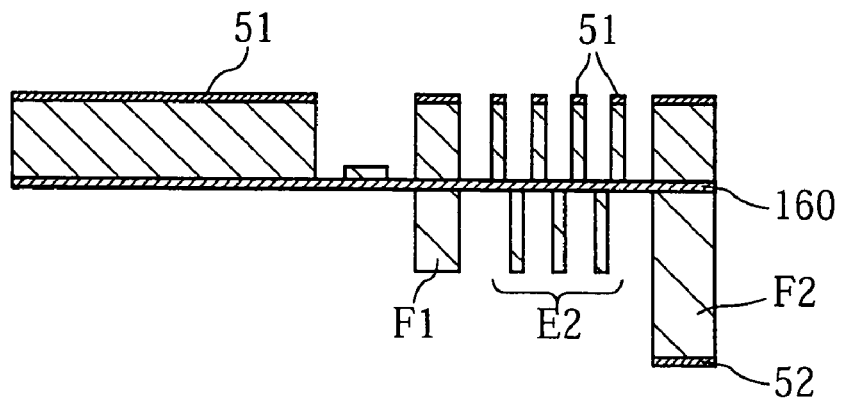

Next, as shown in FIG. 8A, the resist pattern 54 is removed. Then, as shown in FIG. 8B, the second silicon layer 12 masked by the oxide film pattern 52 is etched until the insulating layer 160 is reached. This gives form to part of the inner frame F1, the comb-like electrode E2 and part of the outer frame F2.

Figure 8C:
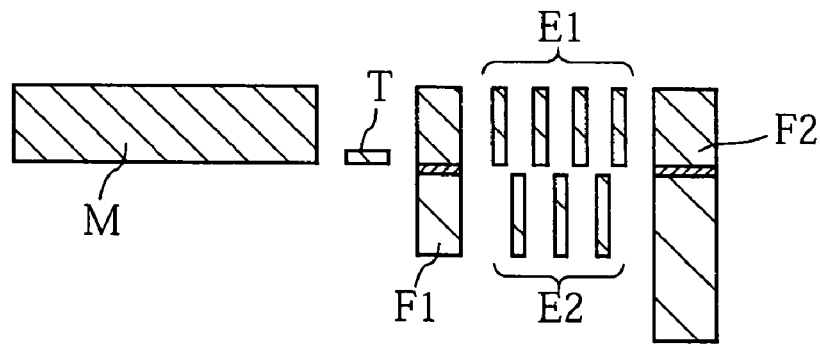

Next, as shown in FIG. 8C, by soaking into an etching solution, the exposed insulation layer 160 is removed by etching. During this step, the oxide film patterns 51, 52 exposed on the surface of the element are removed at the same time. This step gives form to the mirror-formed portion M, the torsion bars T, the inner frame F1, and the comb-like electrodes E1, E2 within 100 μm from the insulating layer 160, and to the outer frame F2 which includes the second outer frame 132 having a thickness of 200 μm. This is how the micro mirror unit X1 is manufactured.

According to such a method as described, the moving part and the two-step comb-like structure are thinner than the material substrate used, i.e. thinner than the wafer. Therefore, it becomes possible, regardless of the thickness to be given to the moving part and the two-step comb-like structure, to use a wafer that have a thickness capable of retaining sufficient strength throughout the entire manufacturing process of the micro mirror unit. Now that it becomes possible to use a wafer that have a thickness capable of retaining sufficient strength regardless of the thickness to be given to the moving part and the two-step comb-like structure, the limitation to the size of the flat surface of the wafer is reduced.

FIG. 9 and FIG. 10 show a second method of making the micro mirror unit X1. This also is a method for manufacturing the above-described micro mirror unit X1 by way of micro-machining technology. For the sake of simplification of the drawings as used in FIG. 6 through FIG. 8, each of the FIG. 9 and FIG. 10 gives only one sectional view to show how formation is made for a mirror-formed portion M, torsion bars T, inner frame F1, a set of comb-like electrodes E1, E2, and an outer frame F2.

Figure 9A:
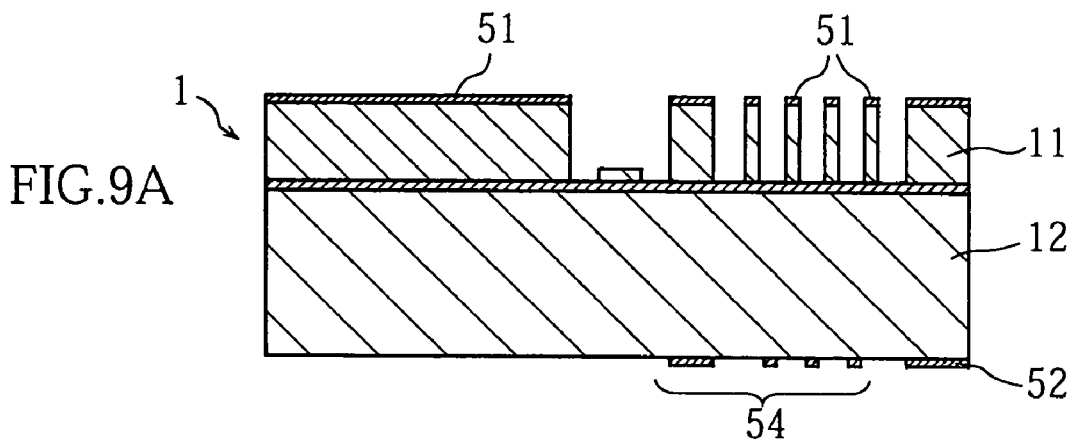
FIGS. 9A–9D show steps of another method of manufacturing the micro mirror unit in FIG. 1.

In the second method of manufacture, first, the same steps as described for the first method with reference to FIG. 6A through FIG. 6D and FIG. 7A through FIG. 7C are followed, until the SOI wafer 1 is as shown in FIG. 9A. Specifically, in the SOI wafer 1 shown in FIG. 9A, the first silicon layer 11 masked by the oxide film pattern 51 is etched by means of the DRIE, and the oxide film pattern 52 and the resist pattern 54 are formed on the second silicon layer 12.

Figure 9B:
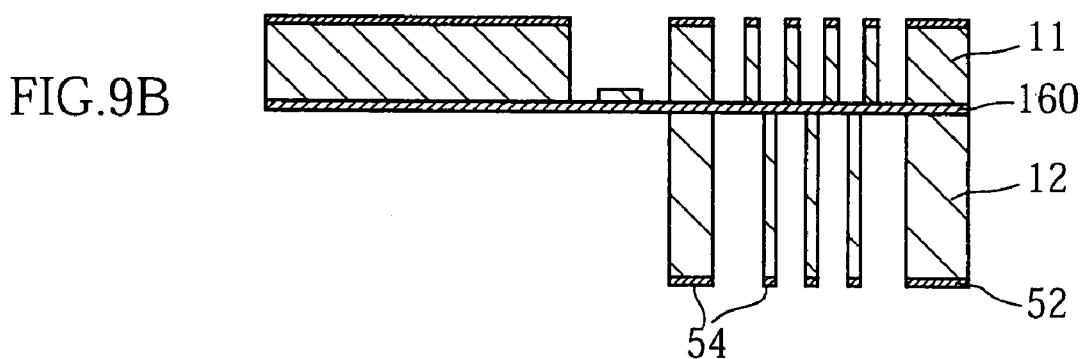
Figure 9C:
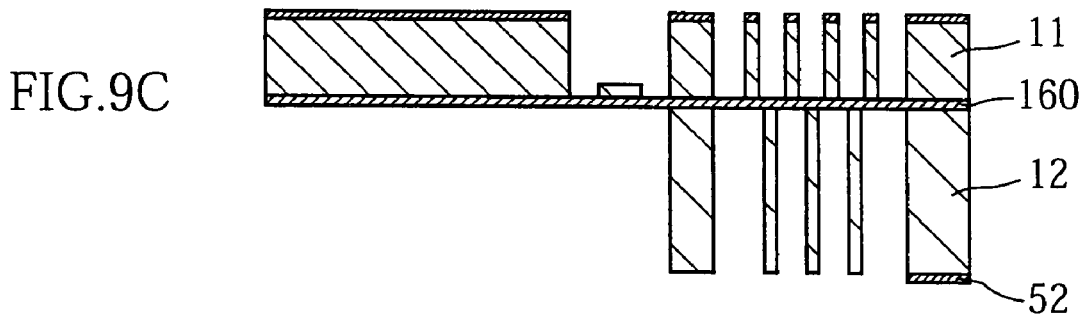

Next, as shown in FIG. 9B, the first silicon layer 11 masked by the resist pattern 54 and the oxide film pattern 52 is etched by means of DRIE until the insulating layer 160 is reached. Thereafter, as shown in FIG. 9C, the resist pattern 54 is removed.

Figure 9D:
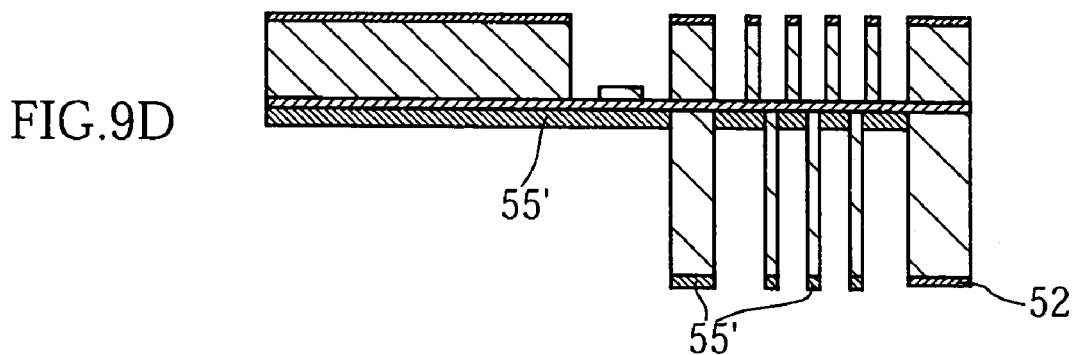

Next, as shown in FIG. 9D, a spray is made from below as in the figure to form a resist pattern 55'. The photo resist solution used in the spraying can be provided by AZP4210 (manufactured by Clariant Japan) diluted to four times with AZ5200 thinner (manufactured by Clariant Japan).

Figure 10A:
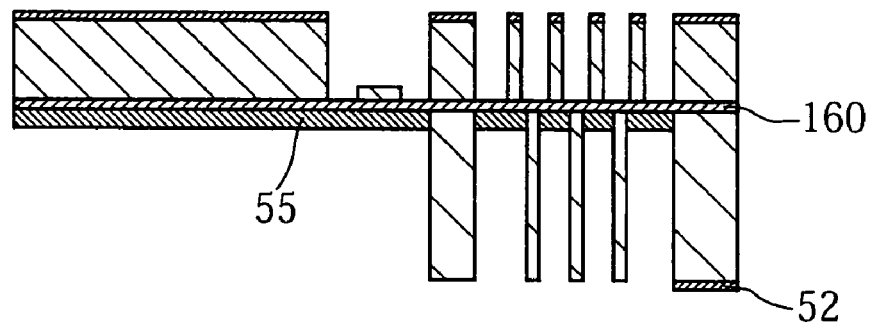
FIGS. 10A–10D show steps following those of FIG. 9.

Next, the photo resist 55' is exposed and developed to form a photo resist 55 as shown in FIG. 10A. The resist pattern 55 is primarily to protect the insulating layer 160.

Figure 10B:
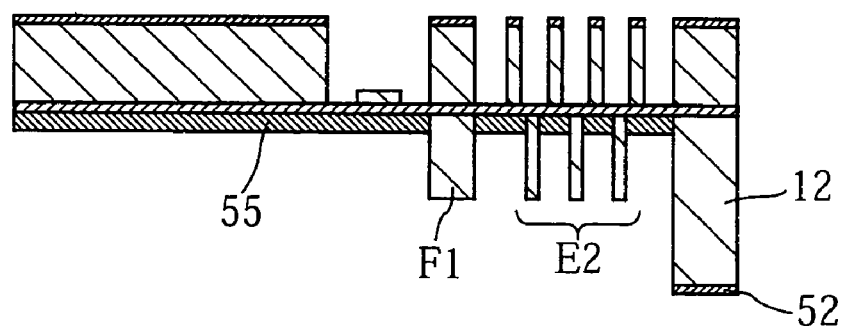

Next, as shown in FIG. 10B, using the DRIE, the second silicon layer 12 masked by the oxide film pattern 52 is etched to a predetermined depth. This step gives form to part of the inner frame F1 and the comb-like electrode E2.

Figure 10C:
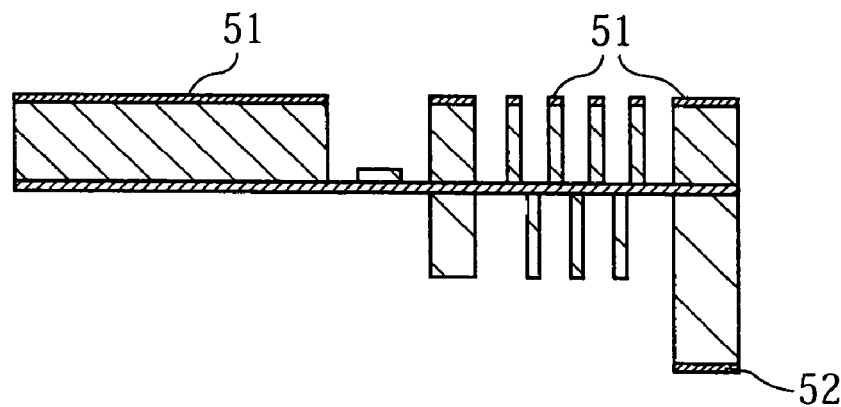
Figure 10D:
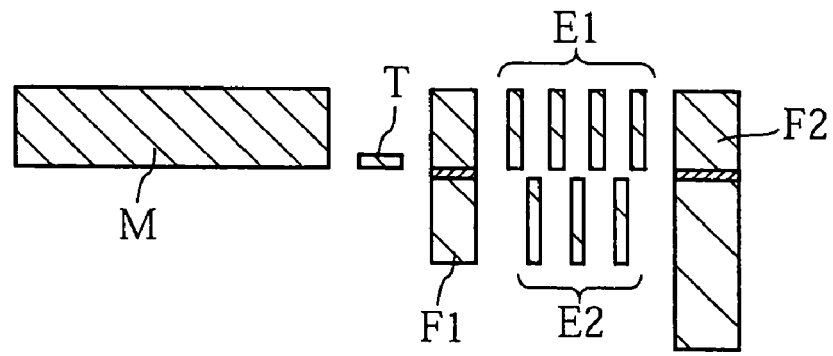

Next, as shown in FIG. 10C, the resist pattern 55 is removed. Then, as shown in FIG. 10D, by soaking into an etching solution, the exposed insulation layer 160 is removed by etching. During this step, the oxide film patterns 51, 52 exposed on the surface of the element are removed at the same time. This step gives form to the mirror-formed portion M, the torsion bars T, the inner frame F1, and the comb-like electrodes E1, E2 within 100 μm from the insulating layer 160, and to the outer frame F2 which includes the second outer frame 132 having a thickness of 200 μm. This is how the micro mirror unit X1 is manufactured.

According to such a method as described, the moving part and the two-step comb-like structure are thinner than the material substrate used, i.e. thinner than the wafer. Therefore, the second method offers the same advantages as achieved by the first method.

FIG. 11 and FIG. 12 show a third method of making the micro mirror unit X1. This also is a method for manufacturing the above-described micro mirror unit X1 by way of micro-machining technology. For the sake of simplification of the drawings as used in FIG. 6 through FIG. 8, each of the FIG. 11 and FIG. 12 gives only one sectional view to show how formation is made for a mirror-formed portion M, torsion bars T, inner frame F1, a set of comb-like electrodes E1, E2, and an outer frame F2.

Figure 11A:
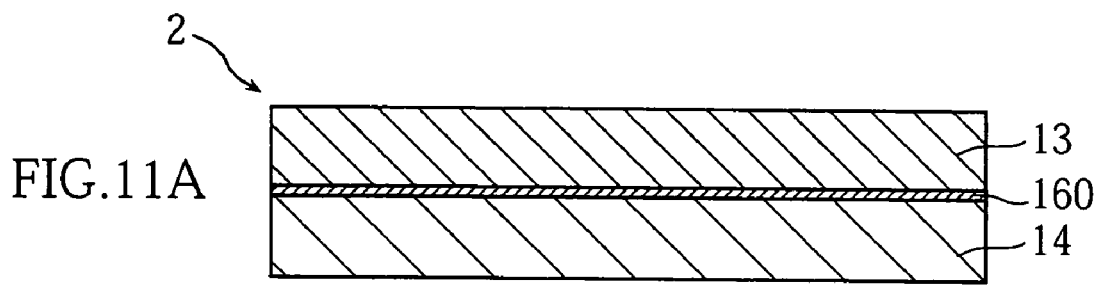
FIGS. 11A–11D show steps of another method of manufacturing the micro mirror unit in FIG. 1.

According to the third method, first, as shown in FIG. 11A, a substrate is prepared. The substrate is provided by an SOI (Silicon on Insulator) wafer 2. The SOI wafer 2 has a layered structure including a first silicon layer 13, a second silicon layer 14, and an insulating layer 160 which is an intermediate layer sandwiched between them. According to the present embodiment, the first silicon layer 13 has a thickness of 100 μm, the second silicon layer 14 has a thickness of 100 μm, and the insulating layer 160 has a thickness of 1 μm. During the preparation of the SOI wafer 2, the silicon layers are given electrical conductivity and the insulating layer 160 is formed, in the same way as described for the first method.

Figure 11B:
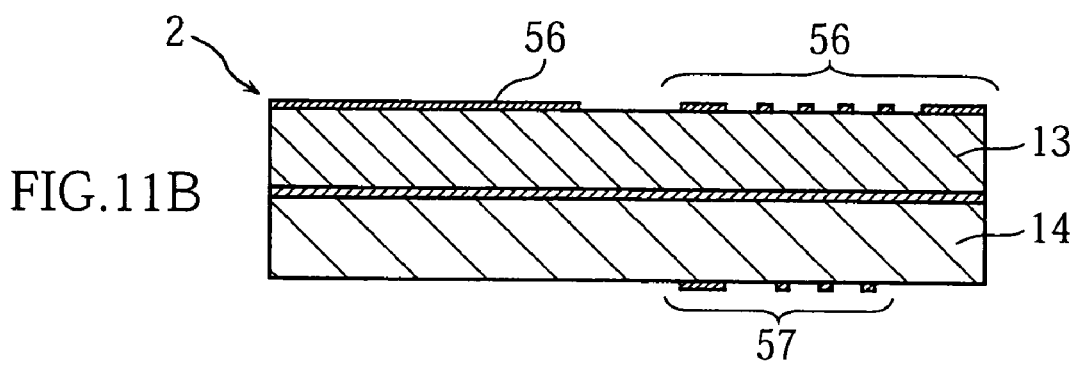

Next, as shown in FIG. 11B, an oxide film pattern 56 is formed on the first silicon layer 13, and an oxide film pattern 57 is formed on the second silicon layer 14. The oxide film pattern 56 is to mask regions to become the mirror-formed portion M, the inner frame F1, the comb-like electrodes E1, and the outer frame F2 on the first silicon layer 13. More specifically, the oxide film pattern 56 is formed correspondingly to a plan-view layout of the mirror-formed portion 110, the inner frame main portion 121, the comb-like electrodes 110a, 110b, the comb-like electrodes 121a, 121b, and the first outer frame 131 shown in FIG. 1. The oxide film pattern 57 is to mask regions to become the inner frame F1 and the comb-like electrode E2 on the second silicon layer 14. More specifically, the oxide film pattern 57 is formed correspondingly to a plan-view layout of the electrode bases 122, the comb-like electrodes 122a, 122b, and the comb-like electrodes 132a, 132b shown in FIG. 1.

Figure 11C:
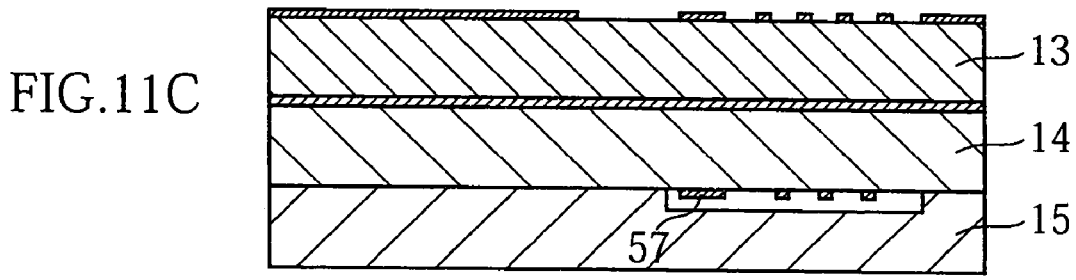

Next, as shown in FIG. 11C, the third silicon layer 15 is bonded directly to the second silicon layer 14 of the SOI wafer 2. The third silicon layer 15 is made of electrically conductive silicon doped with an impurity, and has a thickness of 100 μm. Further, the third silicon layer 15 is formed with a relief space by means of DRIE at a location correspondingly to the oxide film pattern 57. According to the present embodiment, the relief space has a depth of 5 μm. The bonding in this step is performed under a vacuum of $10^{-4}$ Torr, and a temperature of 1100° C. The bonding integrates the third silicon layer 15 with the second silicon layer 14.

Figure 11D:
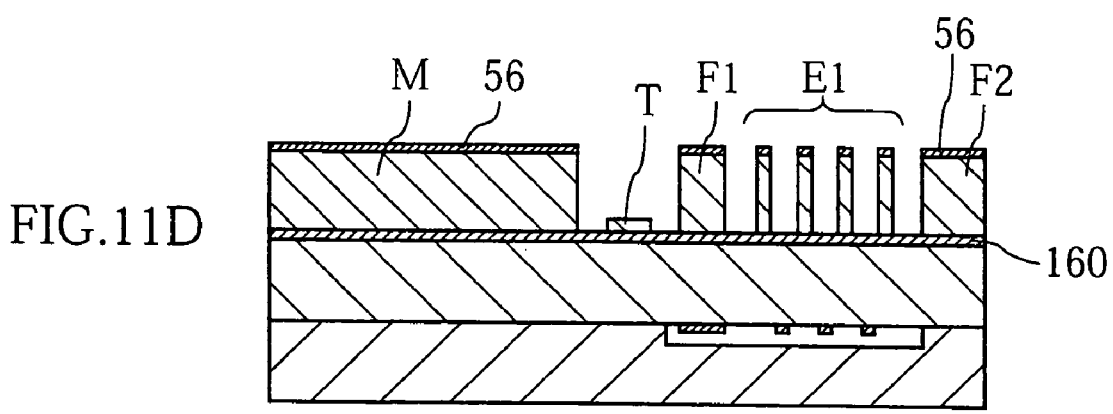

Next, as shown in FIG. 11D, the first silicon layer 13 masked by the oxide film pattern 56 is etched by means of DRIE until the insulating layer 160 is reached. This step gives form to the mirror-formed portion M, the torsion bars T, part of the inner frame F1, the comb-like electrode E1 and part of the outer frame F2.

Figure 12A:
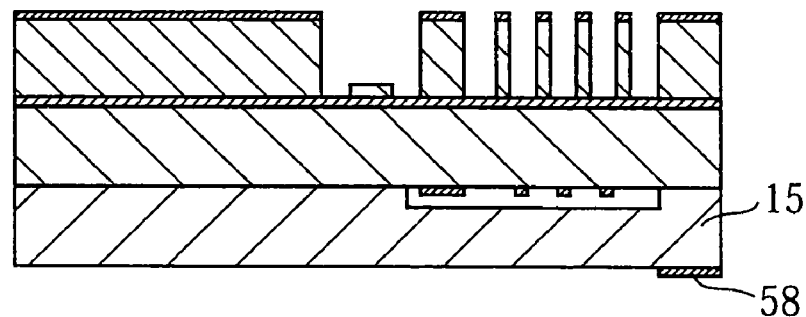
FIGS. 12A–12D show steps following those of FIG. 11.

Next, as shown in FIG. 12A, an oxide film pattern 58 is formed on the third silicon layer 15. The oxide film pattern 58 is to mask a region to become the outer frame F2. More specifically, the oxide film pattern 58 is formed correspondingly to a plan-view layout of the second outer frame 132 shown in FIG. 1.

Figure 12B:
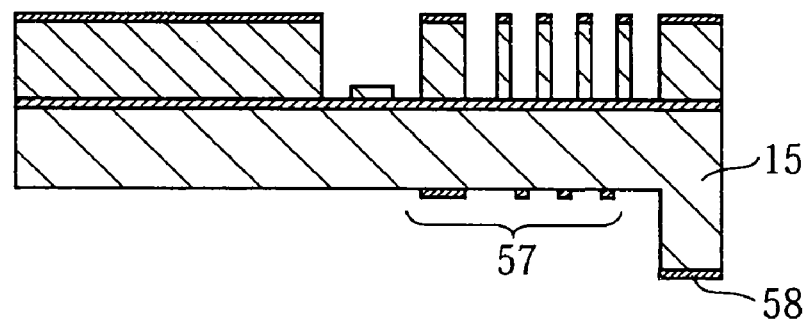

Next, as shown in FIG. 12B, the third silicon layer 15 masked by the oxide film pattern 58 is etched by means of DRIE until the oxide film pattern 57 is exposed.

Figure 12C:
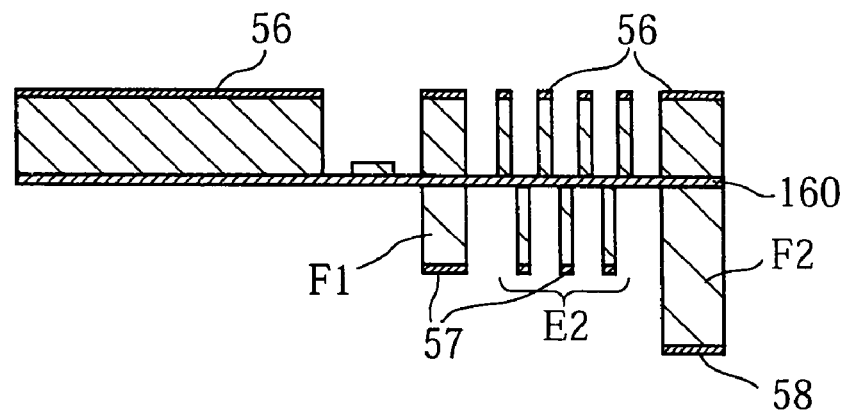

Next, as shown in FIG. 12C, the second silicon layer 14 masked by the oxide film pattern 57 and the oxide film pattern 58 is etched by means of DRIE, until the insulating layer 160 is reached. This gives form to part of the inner frame F1, the comb-like electrode E2 and part of the outer frame F2.

Figure 12D:
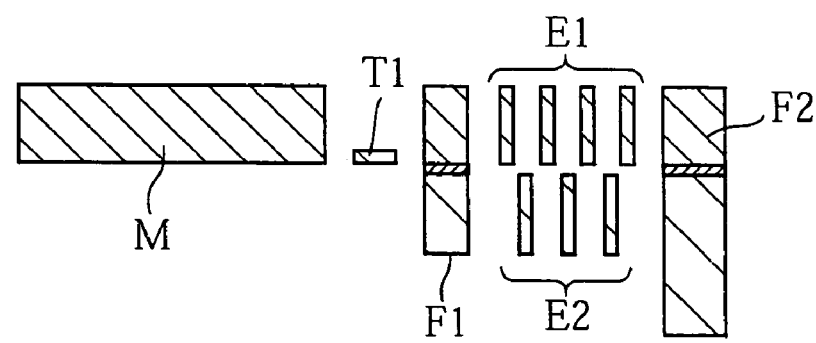

Next, as shown in FIG. 12D, by soaking into an etching solution, the exposed insulation layer 160 is removed by etching. During this step, the oxide film patterns 56, 57, 58 exposed on the surface of the element are removed at the same time. This step gives form to the mirror-formed portion M, the torsion bars T, the inner frame F1, and the comb-like electrodes E1, E2 within 100 μm from the insulating layer 160, and to the outer frame F2 which includes the second outer frame 132 having a thickness of 200 μm. This is how the micro mirror unit X1 is manufactured.

According to such a method as described, it is possible to form the moving part and the two-step comb-like structure in a material substrate, or a wafer, which is thicker than these members. Therefore, the third method offers the same advantages as achieved by the first method. Before the step shown in FIG. 11D, no forming operation which decreases strength of the wafer is performed to the silicon layers. Thus, the size of the flat surface of the wafer is not excessively limited before the step shown in FIG. 11D.

FIG. 13 and FIG. 14 show a fourth method of making the micro mirror unit X1. This also is a method for manufacturing the above-described micro mirror unit X1 by way of micro-machining technology. For the sake of simplification of the drawings as used in FIG. 6 through FIG. 8, each of the FIG. 13 and FIG. 14 gives only one sectional view to show how formation is made for a mirror-formed portion M, torsion bars T, inner frame F1, a set of comb-like electrodes E1, E2, and an outer frame F2.

Figure 13A:
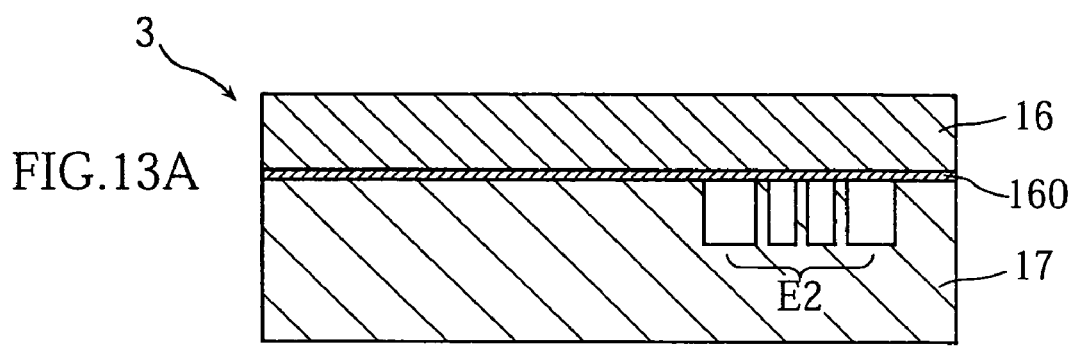
FIGS. 13A–13D show steps of another method of manufacturing the micro mirror unit in FIG. 1.

According to the fourth method, first, as shown in FIG. 13A, a substrate is prepared. The substrate is provided by an SOI wafer 3. The SOI wafer 3 has a layered structure including a first silicon layer 16, a second silicon layer 17, and an insulating layer 160 which is an intermediate layer sandwiched between them. The second silicon layer 17 is already shaped to correspond to the comb-like electrode E2 by means of DRIE. The second silicon layer 17 is bonded to the first silicon layer 16 formed with the insulating layer 160. The comb-like electrode E2 contacts the insulating layer 160. According to the present embodiment, the first silicon layer 16 has a thickness of 100 μm, the second silicon layer 17 has a thickness of 200 μm, and the insulating layer 160 has a thickness of 1 μm. During the preparation of the SOI wafer 3, the silicon layers are given electrical conductivity and the insulating layer 160 is formed, in the same way as described for the first method.

Figure 13B:
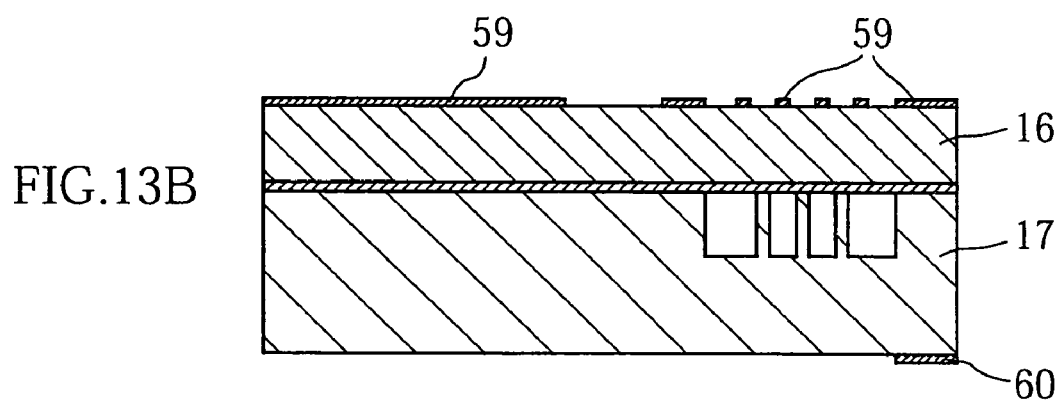

Next, as shown in FIG. 13B, an oxide film pattern 59 is formed on the first silicon layer 16, and an oxide film pattern 60 is formed on the second silicon layer 17. The oxide film pattern 59 is to mask regions to become the mirror-formed portion M, the inner frame F1, the comb-like electrodes E1, and the outer frame F2 on the first silicon layer 16. More specifically, the oxide film pattern 59 is formed correspondingly to a plan-view layout of the mirror-formed portion 110, the inner frame main portion 121, the comb-like electrodes 110a, 110b, the comb-like electrodes 121a, 121b, and the first outer frame 131 shown in FIG. 1. The oxide film pattern 60 is to mask regions to become the outer frame F2 on the second silicon layer 17. More specifically, the oxide film pattern 60 is formed correspondingly to a plan-view layout of the second outer frame 132 shown in FIG. 1.

Figure 13C:
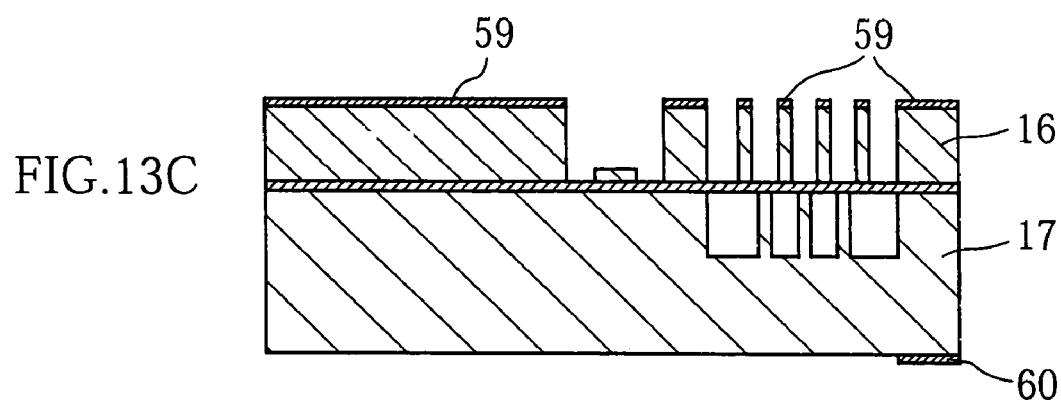

Next, the same steps as described in the first method with reference to FIG. 6A through FIG. 6D and FIG. 7A through FIG. 7B are followed, until the SOI wafer 3 is as shown in FIG. 13C.

Figure 13D:
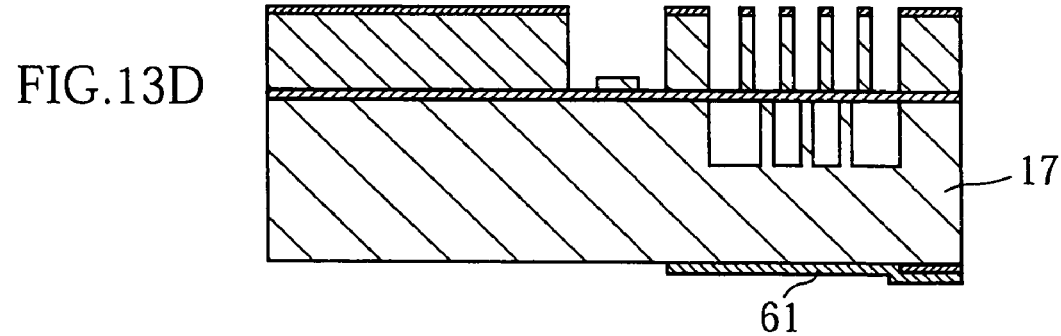

Next, as shown in FIG. 13D, a resist pattern 61 is formed on the second silicon layer 17. The resist pattern 61 is to mask regions to become the inner frame F1, the comb-like electrodes E2, and the outer frame F2 on the second silicon layer 17.

Figure 14A:
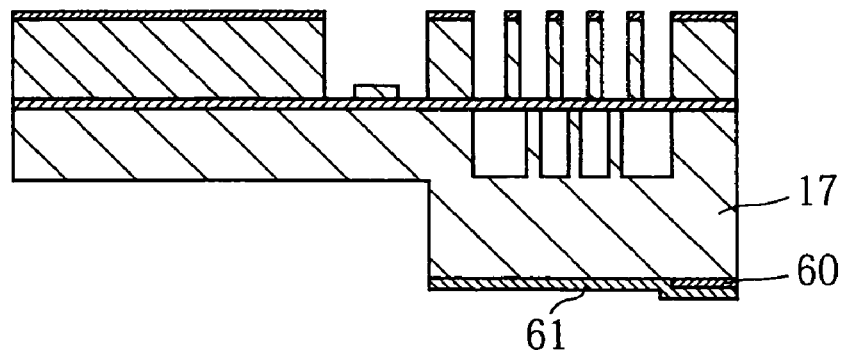
FIGS. 14A–14D show steps following those of FIG. 13.
Figure 14B:
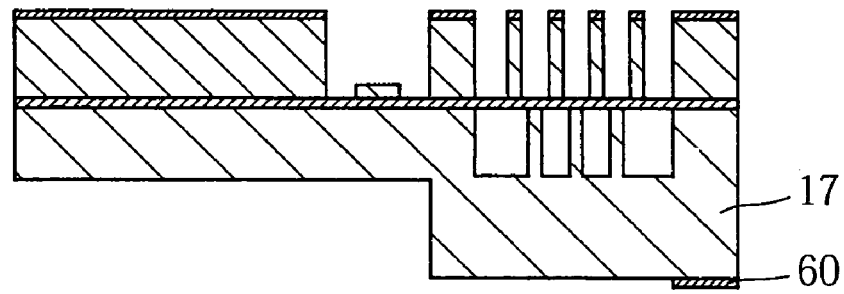

Next, as shown in FIG. 14A, the second silicon layer 17 masked by the resist pattern 61 is etched by means of DRIE to a predetermined depth, or to the height of the comb-like electrode E2. Then, as shown in FIG. 14B, the resist pattern 61 is removed.

Figure 14C:
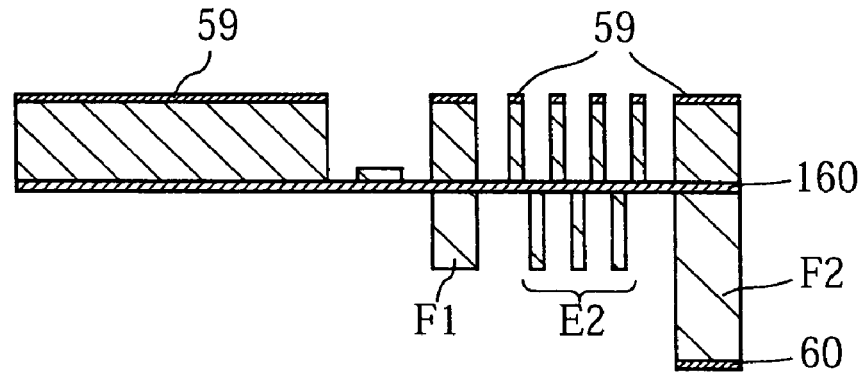

Next, as shown in FIG. 14C, the second silicon layer 17 masked by the oxide film pattern 60 is etched by means of DRIE until the insulating layer 160 is reached. This step gives form to the part of the inner frame F1, the comb-like electrode E2 and part of the outer frame F2.

Figure 14D:
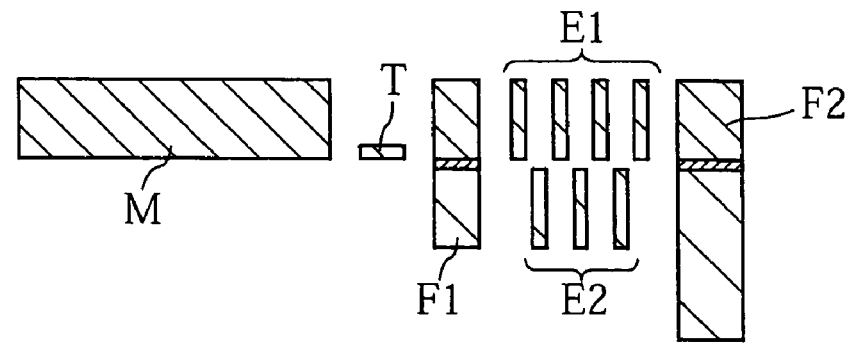

Next, as shown in FIG. 14D, by soaking into an etching solution, the exposed insulation layer 160 is removed by etching. During this step, the oxide film patterns 59, 60 exposed on the surface of the element are removed at the same time. This step gives form to the mirror-formed portion M, the torsion bars T, the inner frame F1, and the comb-like electrodes E1, E2 within 100 μm from the insulating layer 160, and to the outer frame F2 which includes the second outer frame 132 having a thickness of 200 μm. This is how the micro mirror unit X1 is manufactured.

According to such a method as described, it is possible to form the moving part and the two-step comb-like structure which are thinner than a material substrate used, i.e. a wafer. Therefore, the fourth method also offers the same advantages as achieved by the first method.

Figure 15:
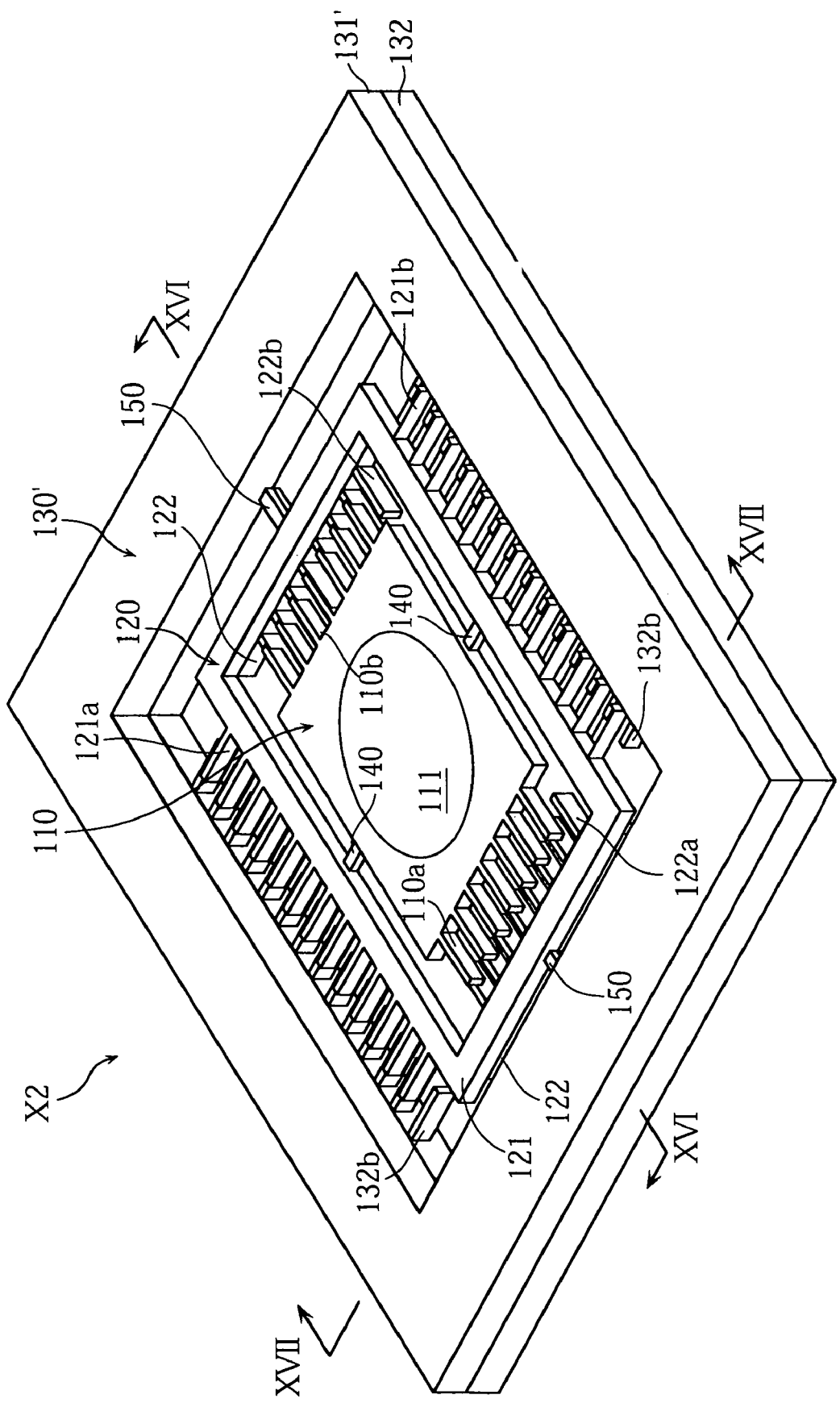
FIG. 15 is a perspective view showing a micro mirror unit according to a second embodiment of the present invention.
Figure 16:
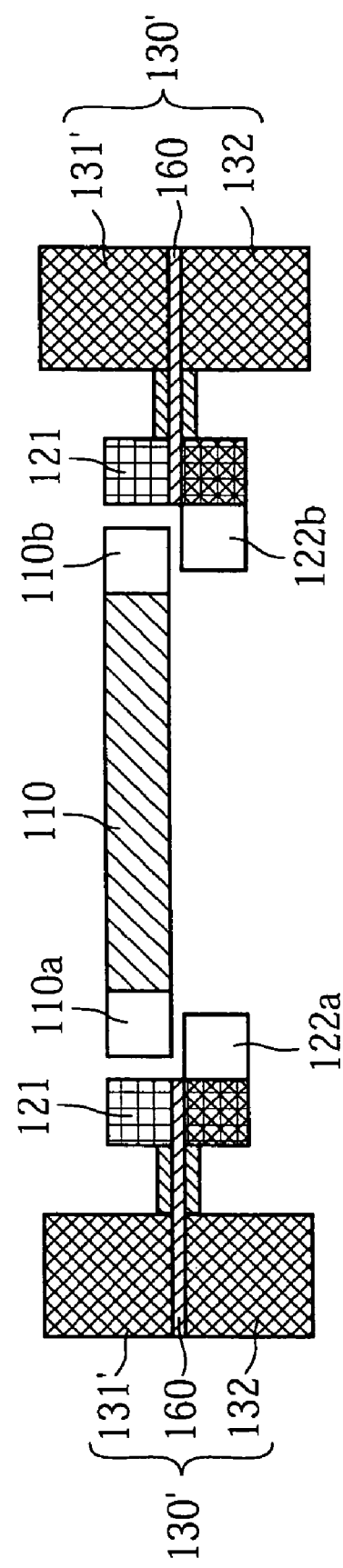
FIG. 16 is a sectional view taken in lines XVI—XVI in FIG. 15.

FIG. 15 is a perspective view of a micro mirror unit X2 according to the second embodiment of the present invention. FIG. 16 is a sectional view taken in lines XVI—XVI in FIG. 15. The micro mirror unit X2 includes a mirror-formed portion 110, an inner frame 120 surrounding it, an outer frame 130' surrounding the inner frame 120, a pair of torsion bars 140 connecting the mirror-formed portion 110 with the inner frame 120 and a pair of torsion bars 150 connecting the inner frame 120 with the outer frame 130'. The micro mirror unit X2 differs from the micro mirror unit X1 in the construction of the outer frame, but the mirror-formed portion 110, the inner frame 120 and the torsion bars 140, 150 of the micro mirror unit X2 are the same as those described for the micro mirror unit X1.

As shown clearly in FIG. 16, the outer frame 130' has a layered structure including a first outer frame 131', a second outer frame 132 and an insulating layer 160 between them. The first outer frame 131' and the second outer frame 132 are electrically insulated from each other by the insulating layer 160. As clearly shown in FIG. 16, the first outer frame 131' extends upwardly beyond the inner frame main portion 121 which is part of the moving part provided by the mirror-formed portion 110 and the inner frame 120. The second outer frame 132 has the same structure as described for the first embodiment.

Figure 17:
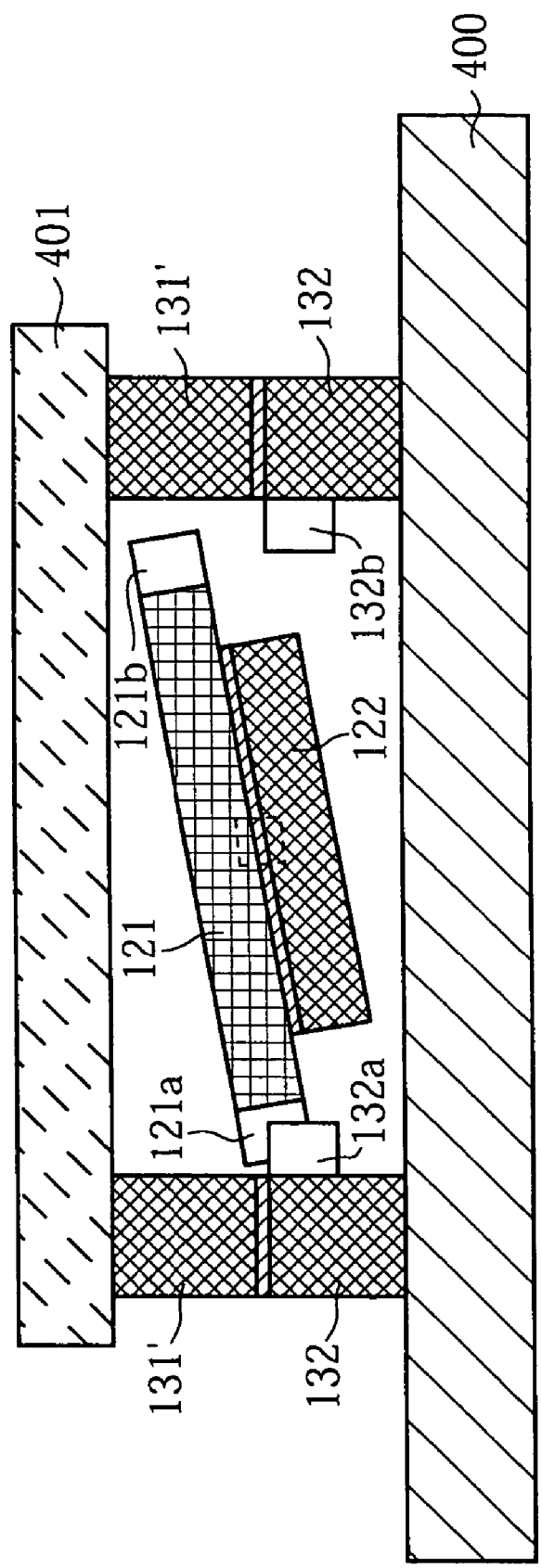
FIG. 17 shows the micro mirror unit of FIG. 15 mounted on a wiring substrate with a transparent cover attached.

FIG. 17 shows the micro mirror unit X2 mounted on a wiring substrate 400 and covered by a transparent cover 401. In the figure, the micro mirror unit X2 is shown in a section taken on lines XVII—XVII in FIG. 15. According to the micro mirror unit X2, the outer frame 130' is thicker than the moving part provided by the mirror-formed portion 110 and the inner frame 120. Specifically, the second outer frame 132 extends downwardly beyond the electrode bases 122 and the comb-like electrodes 122a, 122b of the inner frame 120, and beyond the comb-like electrodes 132a, 132b formed in the outer frame 130. The downward extension of the second outer frame 132 is beyond a depth reached by the moving part in operation, e.g. a depth reached by the electrode bases 122 of the inner frame 120. With this arrangement, a space is provided for the moving part to move under the state in which the wiring substrate 400 is bonded onto the bottom surface of the second outer frame 132, avoiding an unwanted contact of the moving part to the wiring substrate 400. Further, the first outer frame 131' extends upwardly beyond the mirror-formed portion 110, the comb-like electrodes 110a, 110b, the inner frame main portion 121 and the comb-like electrodes 121a, 121b of the inner frame 120. The downward extension of the first outer frame 131' is beyond a height reached by the moving part in operation, e.g. a height reached by the comb-like electrodes 121a, 121b of the inner frame 120. With this arrangement, a space is provided for the moving part to move under the state in which the transparent cover 401 is bonded onto the upper surface of the first outer frame 131', avoiding an unwanted contact of the moving part to the transparent cover 401. Thus, according to the micro mirror unit X2, since the first outer frame 131' and the second outer frame 132 extend beyond the moving part, there is no need for placing a spacer between the micro mirror unit X2 and the wiring substrate 400 or the transparent cover 401 when the micro mirror unit X1 is mounted onto the wiring substrate 400.

FIG. 18 through FIG. 20 show a method of making the micro mirror unit X2. This is a method for manufacturing the above-described micro mirror unit X2 by way of micro-machining technology. For the sake of simplification of the drawings as used in FIG. 6 through FIG. 8, each of the FIG. 18 through FIG. 20 gives only one sectional view to show how formation is made for a mirror-formed portion M, torsion bars T, inner frame F1, an inner frame F1, a set of comb-like electrodes E1, E2, and an outer frame F2.

Figure 18A:
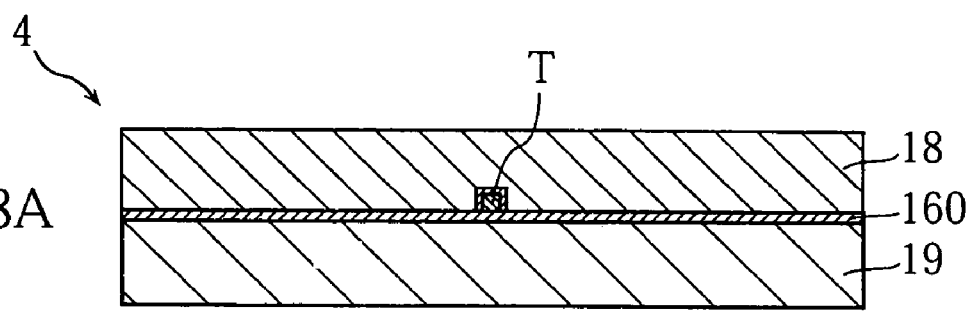
FIGS. 18A–18C show steps of a method of manufacturing the micro mirror unit in FIG. 15.

In the manufacture of the micro mirror unit X2, first, as shown in FIG. 18A, a substrate is prepared. The substrate is provided by an SOI wafer 4. The SOI wafer 4 has a layered structure including a first silicon layer 18, a second silicon layer 19, and an insulating layer 160 which is an intermediate layer sandwiched between them. The first silicon layer 18 is already formed the torsion bars T therein. Specifically, the torsion bars T can be formed in the first silicon layer 18 by first forming a predetermined groove in the first silicon layer 18, then forming an oxide film on the groove surface, and then filling the groove with poly-silicon. The first silicon layer 18 structured as such is bonded to the second silicon layer 19 formed with the insulating layer 160, with the torsion bars T contacted to the insulating layer 160. According to the present embodiment, the first silicon layer 18 has a thickness of 100 μm, the second silicon layer 19 has a thickness of 100 μm, and the insulating layer 160 has a thickness of 1 μm. The torsion bars have a thickness of 5 μm. During the preparation of the SOI wafer 4, the silicon layers are given electrical conductivity and the insulating layer 160 is formed in the same way as described for the first method.

Figure 18B:
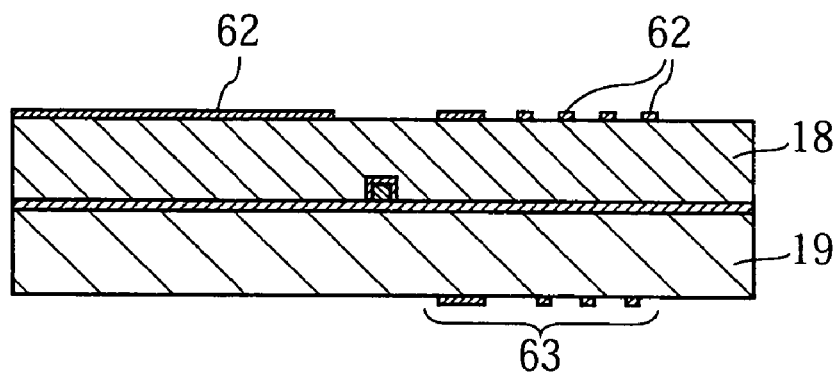

Next, as shown in FIG. 18B, an oxide film pattern 62 is formed on the first silicon layer 18, and an oxide film pattern 63 is formed on the second silicon layer 19. The oxide film pattern 62 is to mask regions to become the mirror-formed portion M, the inner frame F1, and the comb-like electrodes E1 on the first silicon layer 18. More specifically, the oxide film pattern 62 is formed correspondingly to a plan-view layout of the mirror-formed portion 110, the inner frame main portion 121, the comb-like electrodes 110a, 110b, and the comb-like electrodes 121a, 121b shown in FIG. 1. The oxide film pattern 63 is to mask regions to become the outer frame F2 and the comb-like electrode E2 on the second silicon layer 19. More specifically, the oxide film pattern 63 is formed correspondingly to a plan-view layout of the electrode bases 122, the comb-like electrodes 122a, 122b and the second outer frame 132, 132b, shown in FIG. 1.

Figure 18C:
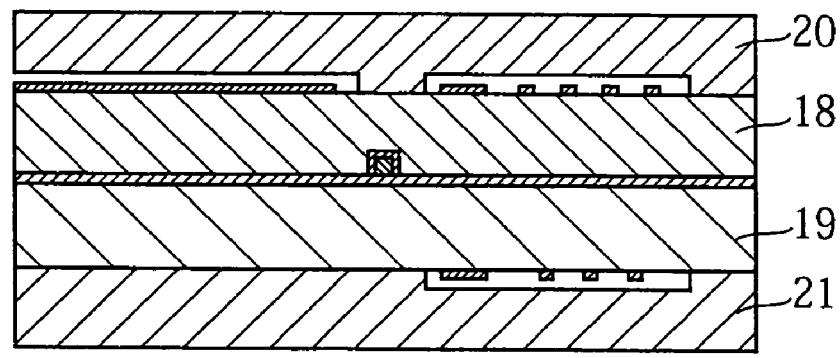

Next, as shown in FIG. 18C, the first silicon layer 18 of the SOI wafer 4 is bonded directly to a third silicon layer 20. Further, a fourth silicon layer 21 is bonded directly to the second silicon layer 19. The third silicon layer 20 and the fourth silicon layer 21 are each made of electrically conductive silicon doped with an impurity, and has a thickness of 100 μm. Further, the third silicon layer 20 and the fourth silicon layer 21 is formed with relief spaces in advance by means of DRIE at locations corresponding to the oxide film patterns 62, 63. According to the present embodiment, the relief spaces have a depth of 5 μ. The bonding in this step is performed under a vacuum of $10^{-4}$ Torr, and a temperature of 1100° C. The bonding integrates the third silicon layer 20 with the first silicon layer 18, and the fourth silicon layer 21 with the second silicon layer 19.

Figure 19A:
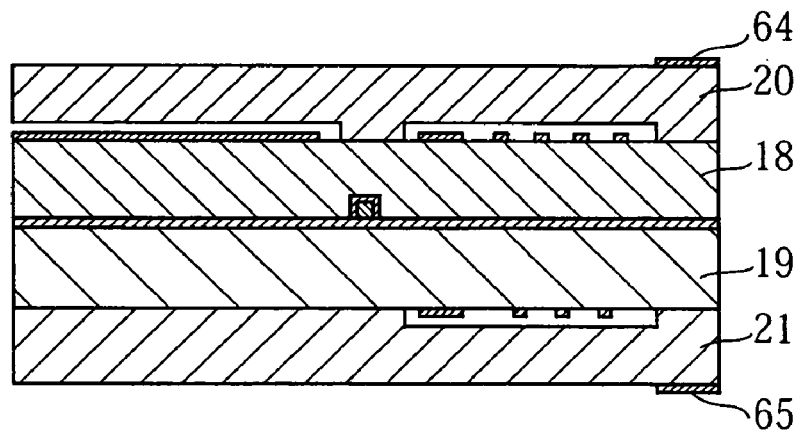
FIGS. 19A–19C show steps following those of FIG. 18.

Next, as shown in FIG. 19A, an oxide film pattern 64 is formed on the third silicon layer 20, and an oxide film pattern 65 is formed on the fourth silicon layer 21. The oxide film pattern 64 is to mask regions to become the outer frame F2 on the third silicon layer 20 and the first silicon layer 18. More specifically, the oxide film pattern 64 is formed correspondingly to a plan-view layout of the first outer frame 131' shown in FIG. 15. The oxide film pattern 65 is to mask a region to become the outer frame F2 on the fourth silicon layer 21. More specifically, the oxide film pattern 65 is formed correspondingly to a plan-view layout of the second outer frame 132 shown in FIG. 15.

Figure 19B:
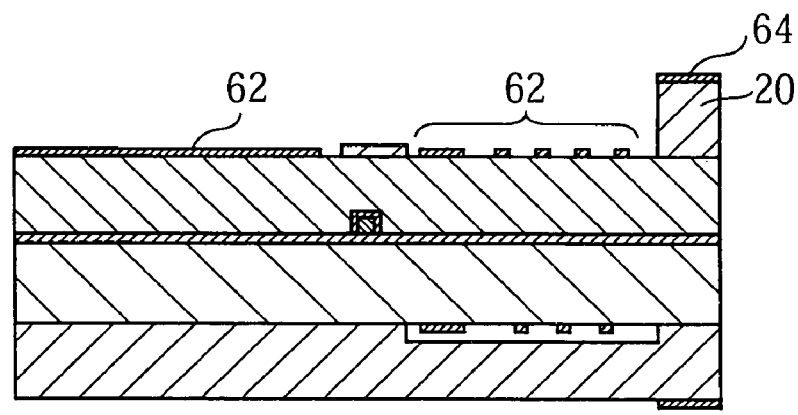
Figure 19C:
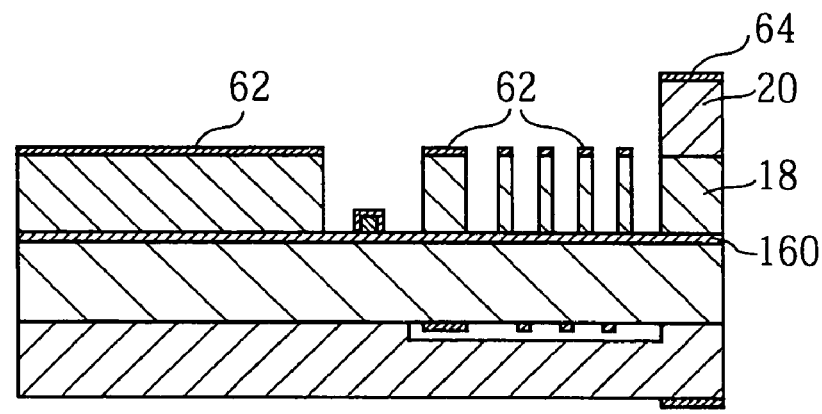

Next, as shown in FIG. 19B, the third silicon layer 20 masked by the oxide film pattern 64 is etched by means of DRIE until the oxide film pattern 62 is exposed. Next, as shown in FIG. 19C, the first silicon layer 18 masked by the oxide film pattern 62 and the oxide film pattern 64 is etched by means of DRIE, until the insulating layer 160 is reached.

Figure 20A:
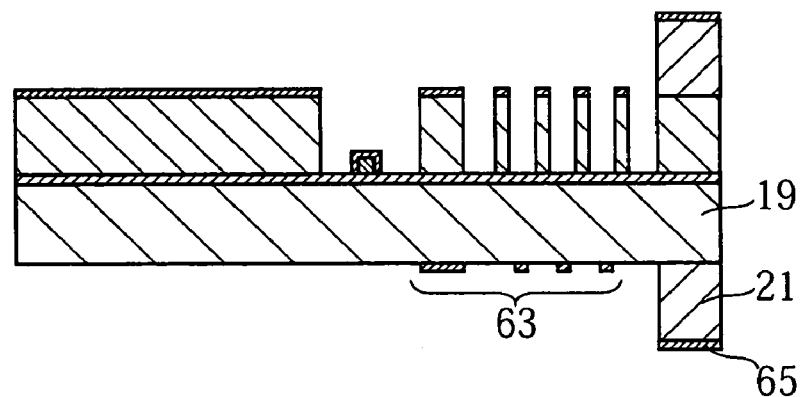
FIGS. 20A–20C show steps following those of FIG. 19.
Figure 20B:
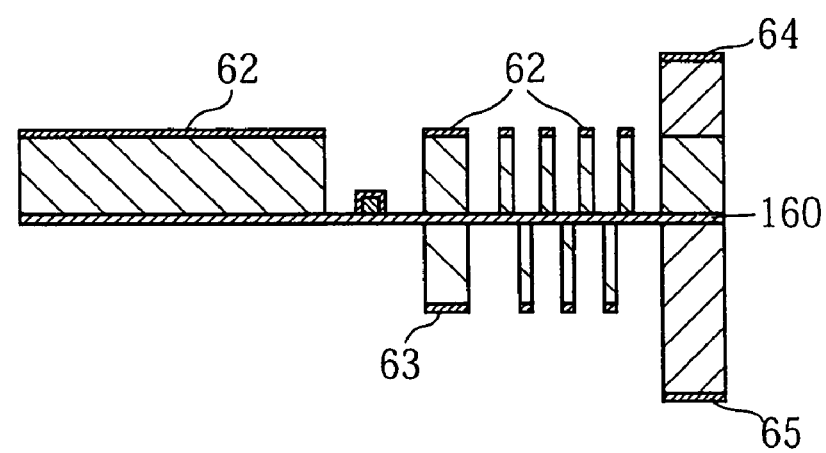

Next, as shown in FIG. 20A, the fourth silicon layer 21 masked by the oxide film pattern 65 is etched by means of DRIE until the oxide film pattern 63 is exposed. Next, as shown in FIG. 20B, the second silicon layer 19 masked by the oxide film pattern 63 and the oxide film pattern 65 is etched by means of DRIE, until the insulating layer 160 is reached.

Figure 20C:
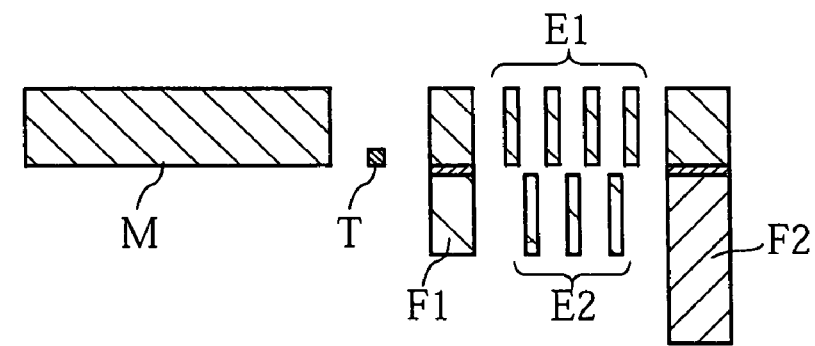
Figure 21:
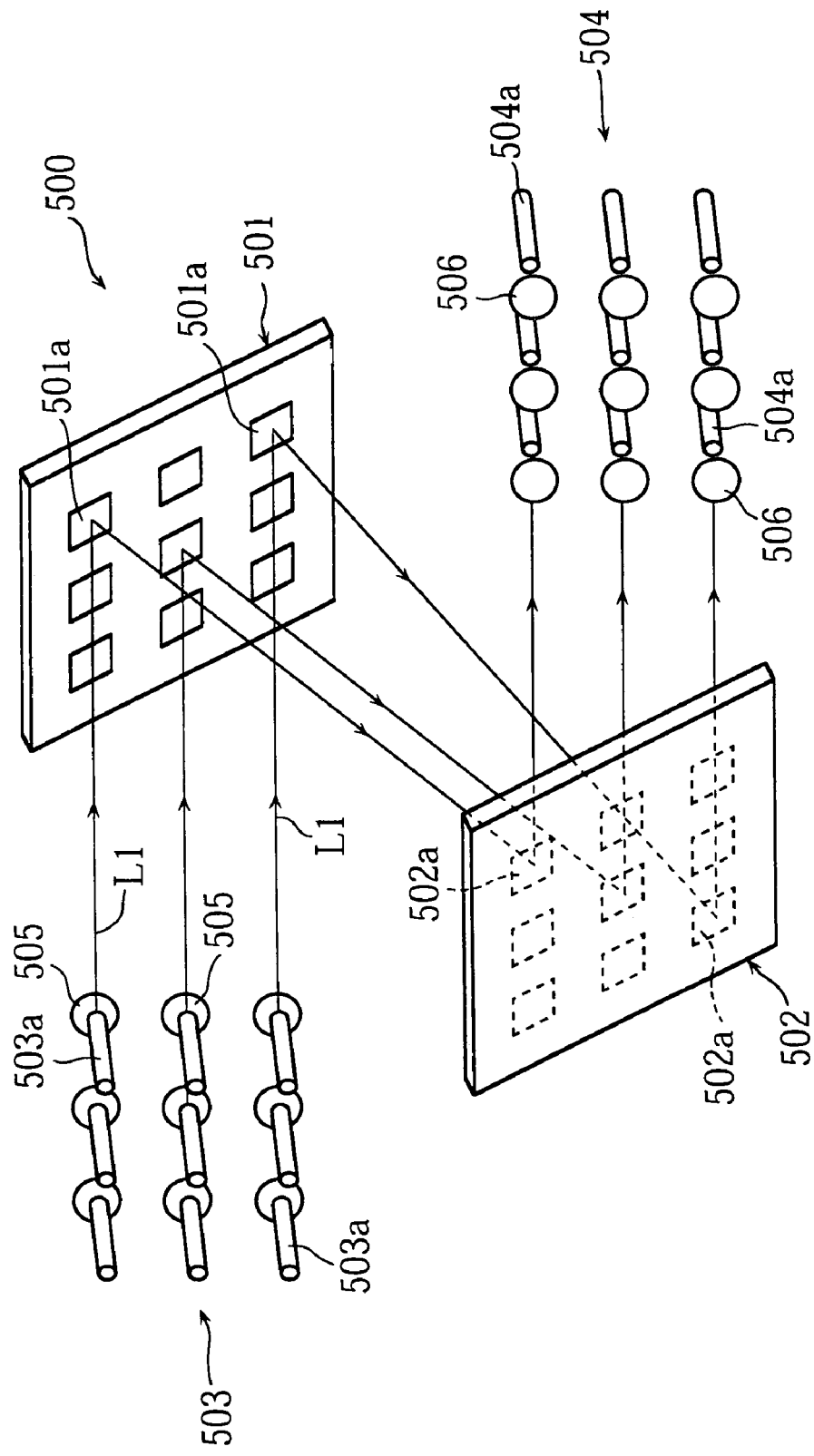
FIG. 21 is a schematic view showing a conventional optical switching device.
Figure 22:
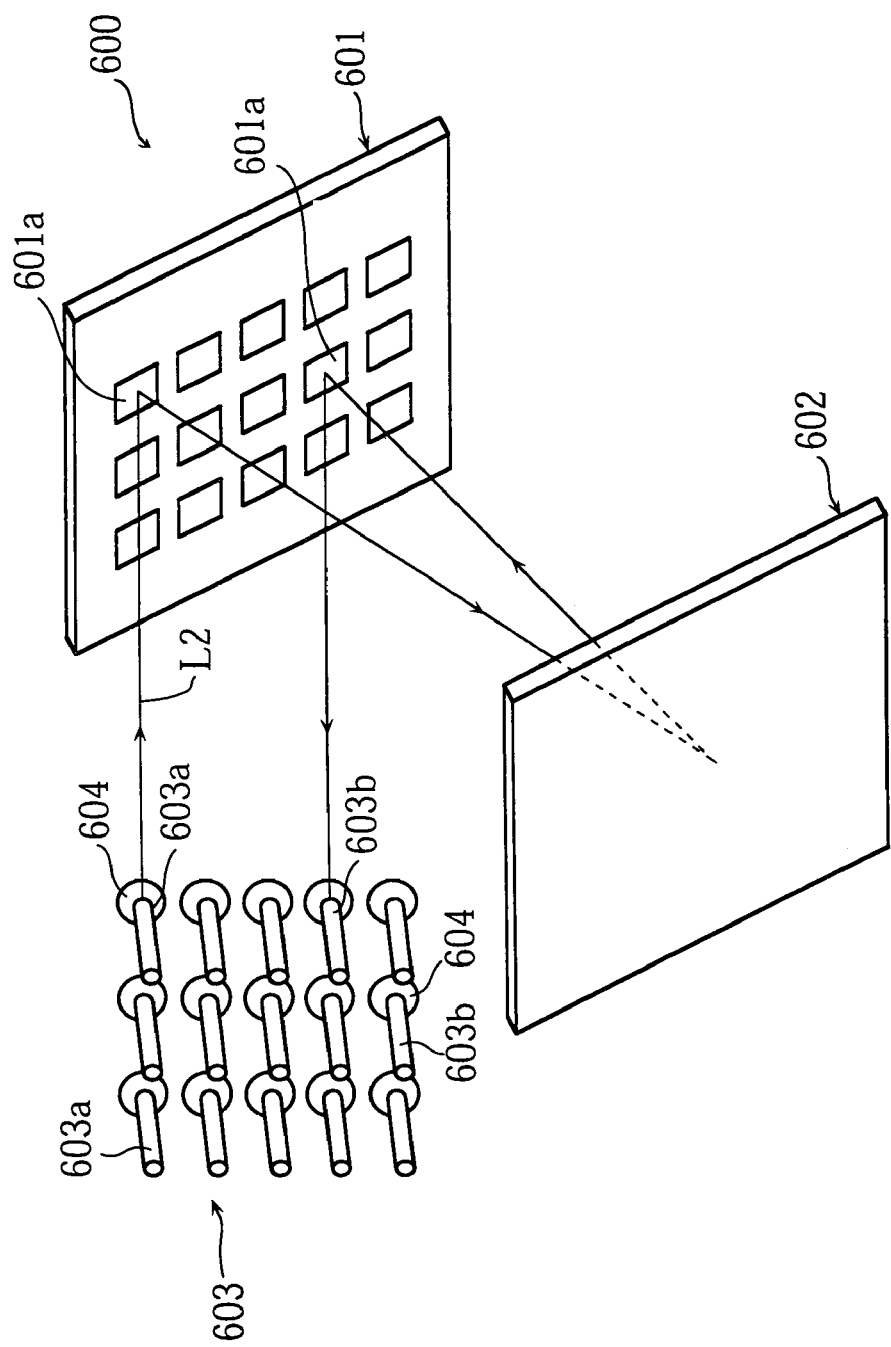
FIG. 22 is a schematic view showing another conventional optical switching device.
Figure 23:
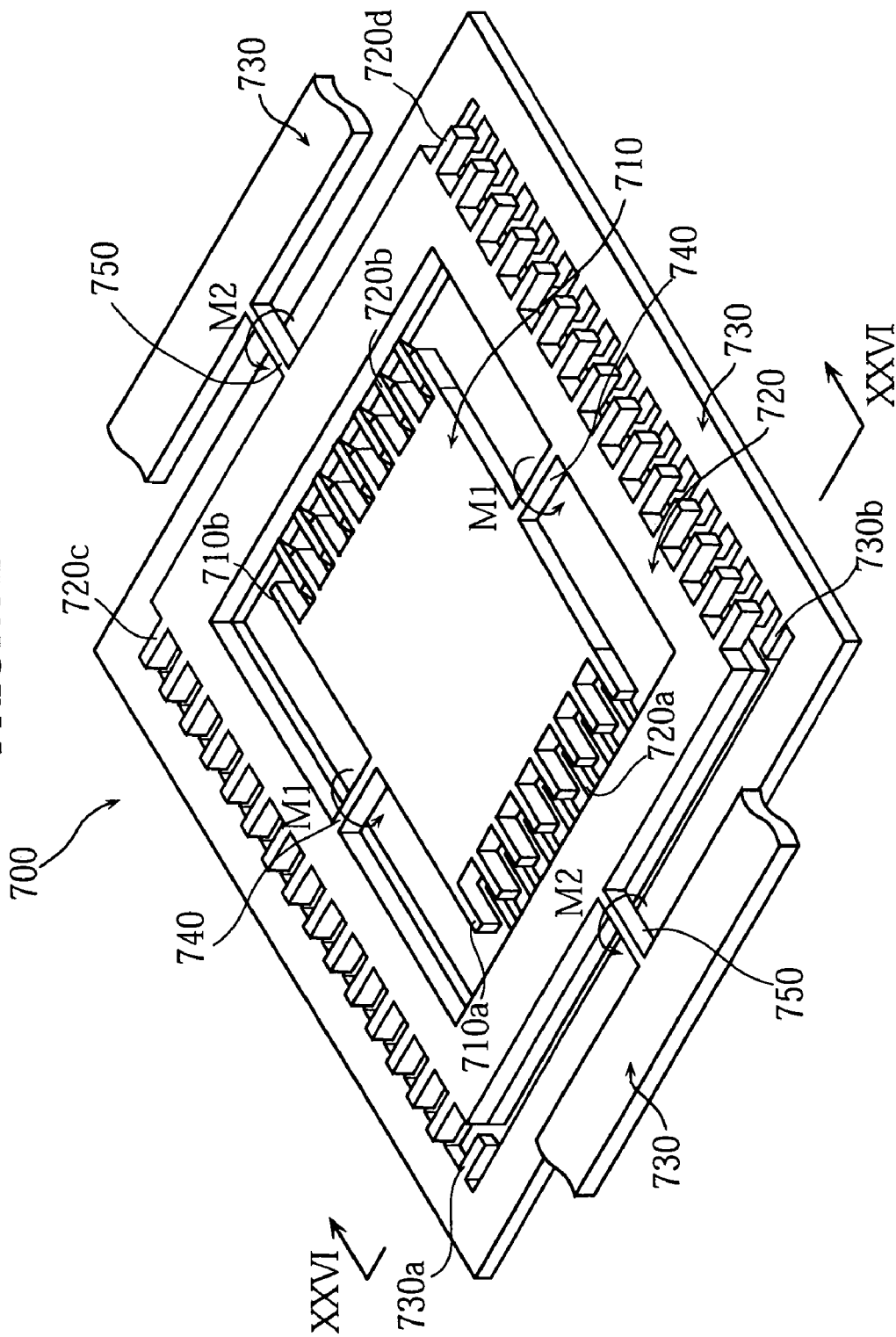
FIG. 23 is a perspective view showing a conventional micro mirror unit provided with comb-like electrodes.
Figure 24A:
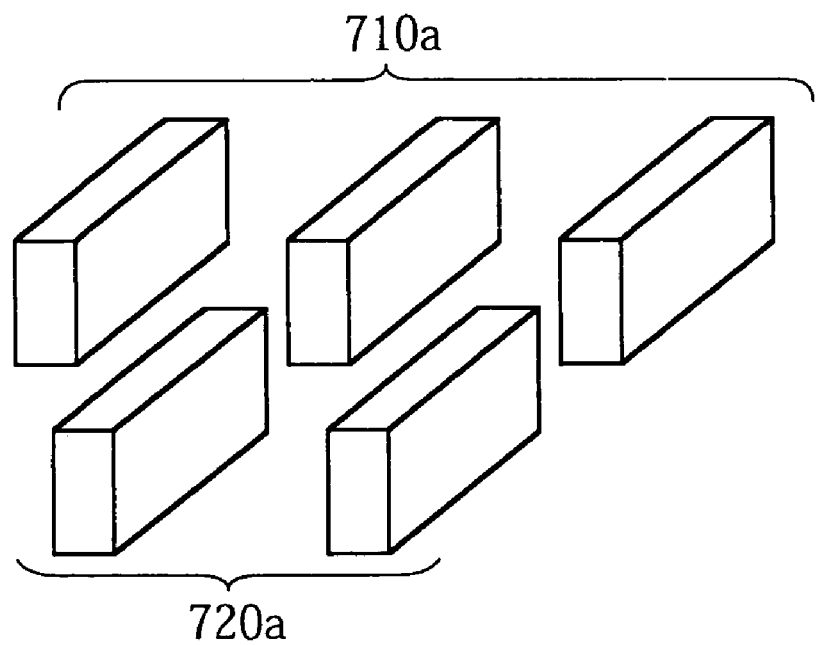
FIGS. 24A–24B show the arrangement of comb-like electrodes operating in a pair.
Figure 24B:
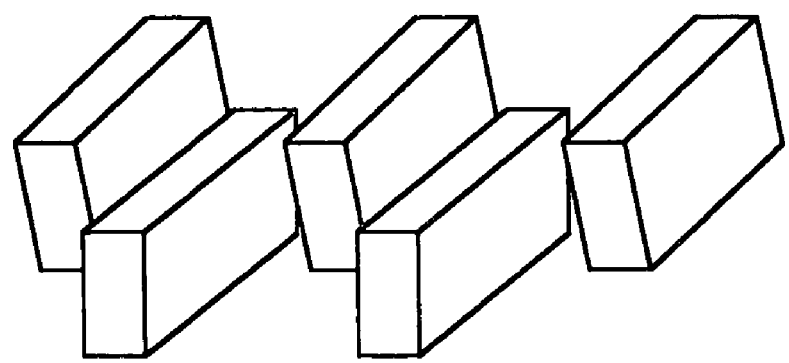
Figure 25A:
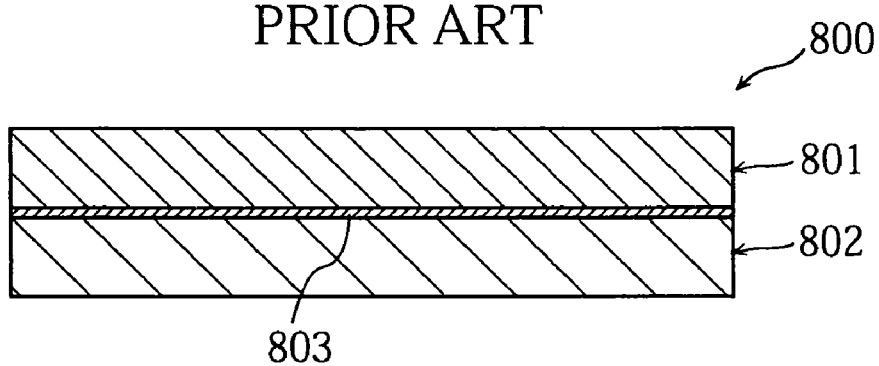
FIGS. 25A–25C show steps of a method of manufacturing the conventional micro mirror unit in FIG. 23.
Figure 25B:
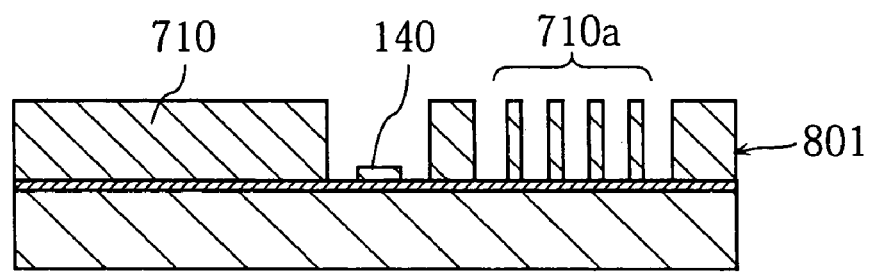
Figure 25C:
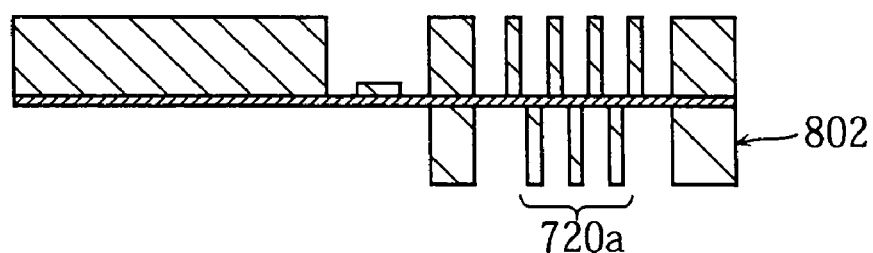
Figure 26:
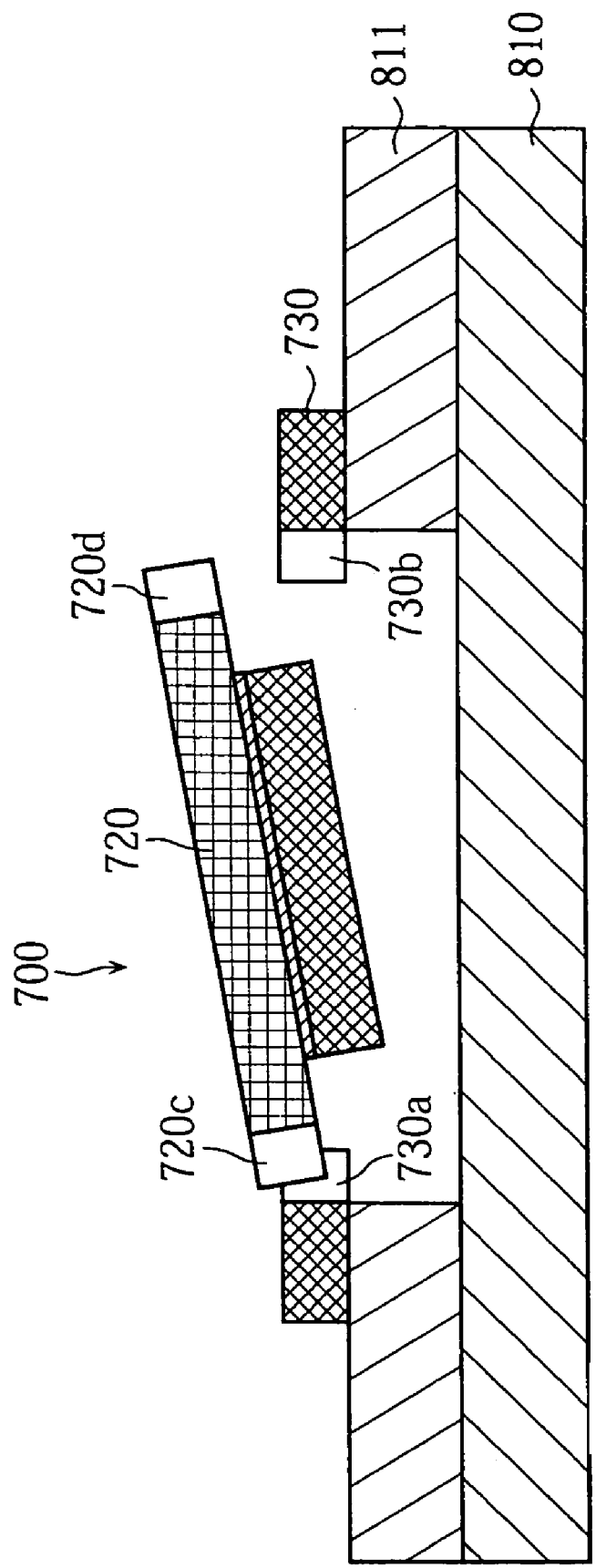
FIG. 26 shows a state in which the micro mirror unit in FIG. 23 is in operation.

Next, as shown in FIG. 20C, by soaking into an etching solution, the exposed insulation layer 160 is removed by etching. During this step, the oxide film patterns 62 through 65 exposed on the surface of the element are removed at the same time. This step gives form to the mirror-formed portion M, the torsion bars T, the inner frame F1, and the comb-like electrodes E1, E2 within 100 μm from the insulating layer 160, and to the outer frame F2 including the first outer frame 131' and the second outer frame 132 having a thickness of 200 μm. This is how the micro mirror unit X2 is manufactured.

According to such a method as described, it is possible to form the moving part and the two-step comb-like structure in a material substrate, i.e. a wafer, which is thicker than these members. Therefore, this method also offers the same advantages as achieved by the first method. Before the step shown in FIG. 19B, no forming operation which decreases strength of the wafer is performed to the silicon layers. Thus, the size of the flat surface of the wafer is not excessively limited before the step shown in FIG. 19B.

In any of the methods for making the micro mirror units described above, formation of the mirror surface 111 on the mirror-formed portion 110 is performed before the region to become the mirror-formed portion 110 is covered by the oxide film pattern by means of CVD method. The mirror surface 111 can be formed by spattering Au or Cr onto a region to become the mirror-formed portion 110 on the silicon layer.

As for the process performed to the lower layer of the insulating layer 160 in the micro mirror unit X2, the process described earlier may be replaced by one of the processes performed to the lower layer in one of the first and the fourth methods described earlier. Such a combination of processes also makes possible to manufacture a micro mirror unit X2 having its outer frame 130' extending both upwardly and downwardly.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

The invention claimed is:

1. A micro mirror unit comprising a moving part, a frame and a torsion bar connecting the moving part to the frame,
   wherein the moving part, the frame and the torsion bar are formed integral from a common material substrate having a layered structure including an intermediate layer and silicon layers sandwiching the intermediate layer,
   wherein the moving part includes: a first intermediate portion originating from the intermediate layer; a first structural member held in contact with the first intermediate portion and provided with a mirror portion; and a second structural member held in contact with the first intermediate portion on a side opposite to the first structural member;
   wherein the frame includes: a second intermediate portion originating from the intermediate layer; a third structural member held in contact with the second intermediate portion on a same side as the first structural member; and a fourth structural member held in contact with the second intermediate portion on a same side as the second structural member; and
   wherein the third structural member extends beyond the first structural member in a layering direction of the layered structure.

2. The micro mirror unit according to claim 1, wherein the moving part includes a first comb-like electrode, the frame including a second comb-like electrode for operation of the moving part by static electric force generated between the first and the second comb-like electrodes.

3. The micro mirror unit according to claim 2, wherein the first comb-like electrode is formed in the first structural member, the second comb-like electrode being formed in the fourth structural member at a portion contacting the second intermediate portion.

4. The micro mirror unit according to claim 1, wherein the moving part includes: a relay frame connected to the frame via the torsion bar; a mirror-formed portion spaced from the relay frame; and a relay bar connecting the relay frame to the mirror-formed portion, the relay bar extending in a direction across a direction in which the torsion bar extends.

5. The micro mirror unit according to claim 4, wherein the mirror-formed portion includes a third comb-like electrode, the relay frame including a fourth comb-like electrode for operation of the mirror-formed portion by static electric force generated between the third and the fourth comb-like electrodes.

6. The micro mirror unit according to claim 5, wherein the third comb-like electrode is formed in the first structural member, the fourth comb-like electrode being formed in the second structural member.

* * * * *